(12) United States Patent
Misaki

(10) Patent No.: US 11,349,209 B2
(45) Date of Patent: May 31, 2022

(54) SCANNING ANTENNA AND METHOD FOR MANUFACTURING SCANNING ANTENNA

(71) Applicant: Sharp Kabushiki Kaisha, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 359 days.

(21) Appl. No.: 16/636,667

(22) PCT Filed: Aug. 2, 2018

(86) PCT No.: PCT/JP2018/029107
§ 371 (c)(1),
(2) Date: Feb. 5, 2020

(87) PCT Pub. No.: WO2019/031392
PCT Pub. Date: Feb. 14, 2019

(65) Prior Publication Data
US 2021/0151883 A1 May 20, 2021

(30) Foreign Application Priority Data

Aug. 9, 2017 (JP) .............................. JP2017-154271

(51) Int. Cl.
*H01Q 3/46* (2006.01)
*H01L 27/12* (2006.01)
*H01Q 13/10* (2006.01)

(52) U.S. Cl.
CPC ............. *H01Q 3/46* (2013.01); *H01L 27/124* (2013.01); *H01L 27/1255* (2013.01); *H01L 27/1259* (2013.01); *H01Q 13/10* (2013.01)

(58) Field of Classification Search
CPC ...... H01Q 13/10; H01Q 21/0012; H01Q 3/46; H01Q 3/44; H01L 27/124; H01L 27/1255; H01L 27/1257; H05K 1/09; H05K 1/16
See application file for complete search history.

(56) References Cited

U.S. PATENT DOCUMENTS

| 10,937,812 B2 * | 3/2021 | Misaki ............... H01Q 21/0012 |
| 2008/0036664 A1 | 2/2008 | Haziza |

(Continued)

FOREIGN PATENT DOCUMENTS

| JP | 2007-116573 A | 5/2007 |
| JP | 2007-295044 A | 11/2007 |

(Continued)

OTHER PUBLICATIONS

Stevenson et al., "Rethinking Wireless Communications: Advanced Antenna Design using LCD Technology", SID 2015 Digest, 55.2, 2015, pp. 827-830.

(Continued)

*Primary Examiner* — Seokjin Kim
(74) *Attorney, Agent, or Firm* — Keating & Bennett, LLP

(57) ABSTRACT

A method for manufacturing a scanning antenna with a plurality of antenna units arrayed therein, the scanning antenna including a TFT substrate including a first dielectric substrate, a TFT, gate bus lines, source bus lines, and a plurality of patch electrodes, a slot substrate including a second dielectric substrate and a slot electrode including a plurality of slots disposed corresponding to the plurality of patch electrodes, a liquid crystal layer, and a reflective conductive plate, includes a step (a) of depositing a first conductive film containing copper on a first main surface of the second dielectric substrate, a step (b) of, after step (a), bringing the first conductive film into contact with an atmosphere to form an oxide film on a surface of the first (Continued)

conductive film, and a step (c) of, after step (b), depositing a second conductive film containing copper on the oxide film.

14 Claims, 16 Drawing Sheets

(56) References Cited

U.S. PATENT DOCUMENTS

2012/0194399 A1  8/2012  Bily et al.
2017/0256865 A1* 9/2017  Sikes ........................ H01Q 1/38
2017/0302004 A1* 10/2017 Stevenson ............ H01Q 21/065
2018/0337446 A1  11/2018 Nakazawa et al.

FOREIGN PATENT DOCUMENTS

| JP | 2009-538565 A | 11/2009 |
| JP | 2010-252246 A | 11/2010 |
| JP | 2013-539949 A | 10/2013 |
| WO | 2015/126550 A1 | 8/2015 |
| WO | 2017/061527 A1 | 4/2017 |

OTHER PUBLICATIONS

Ando et al., "A Radial Line Slot Antenna for 12 GHz Satellite TV Reception", IEEE Transactions on Antennas and Propagation, vol. AP-33, No. 12, Dec. 1985, pp. 1347-1353.

\* cited by examiner

I-I' CROSS SECTION             J-J' CROSS SECTION (a)

(b)

(c)

(d)

I-I' CROSS SECTION     J-J' CROSS SECTION (a)

(b)

(c)

(d)

I-I' CROSS SECTION
J-J' CROSS SECTION (a)

(b)

(c)

(d)

(e)

(f)

I-I' CROSS SECTION    J-J' CROSS SECTION (a)

(b)

(c)

(d)

(e)

(f)

SCANNING ANTENNA AND METHOD FOR MANUFACTURING SCANNING ANTENNA

TECHNICAL FIELD

The disclosure relates to a scanning antenna, and more particularly relates to a scanning antenna in which an antenna unit (also referred to as an "element antenna") includes a liquid crystal capacitance (also referred to as a "liquid crystal array antenna"), and a method for manufacturing such a scanning antenna.

BACKGROUND ART

Antennas for mobile communication and satellite broadcasting require functions that can change the beam direction (referred to as "beam scanning" or "beam steering"). As an example of an antenna (hereinafter referred to as a "scanning antenna" (scanned antenna) having such functionality, phased array antennas equipped with antenna units are known. However, known phased array antennas are expensive, which is an obstacle for popularization as a consumer product. In particular, as the number of antenna units increases, the cost rises considerably.

Therefore, scanning antennas that utilize the high dielectric anisotropy (birefringence index) of liquid crystal materials (including nematic liquid crystals and polymer dispersed liquid crystals) have been proposed (PTL 1 to PTL 5 and NPL 1). Since the dielectric constant of liquid crystal materials has a frequency dispersion, in the present specification, the dielectric constant in a frequency band for microwaves (also referred to as the "dielectric constant for microwaves") is particularly denoted as "dielectric constant $M(\varepsilon_M)$".

PTL 3 and NPL 1 describe how an inexpensive scanning antenna can be obtained by using liquid crystal display (hereinafter referred to as "LCD") device technology.

The present inventors have developed a scanning antenna which can be mass-manufactured by utilizing known manufacturing techniques of LCDs. PTL 6 by the present inventors discloses a scanning antenna which can be mass-manufactured by utilizing the known manufacturing techniques of LCDs, a TFT substrate used for such a scanning antenna, and a manufacturing method and a driving method of such a scanning antenna. For reference, the entire contents disclosed in PTL 6 are incorporated herein.

CITATION LIST

Patent Literature

PTL 1: JP 2007-116573 A
PTL 2: JP 2007-295044 A
PTL 3: JP 2009-538565 A
PTL 4: JP 2013-539949 A
PTL 5: WO 2015/126550
PTL 6: WO 2017/061527
PTL 7: JP 2010-252246 A

Non-Patent Literature

NPL 1: R. A. Stevenson et al., "Rethinking Wireless Communications: Advanced Antenna Design using LCD Technology", SID 2015 DIGEST, pp. 827-830.

NPL 2: M. ANDO et al., "A Radial Line Slot Antenna for 12 GHz Satellite TV Reception", IEEE Transactions of Antennas and Propagation, Vol. AP-33, No. 12, pp. 1347-1353 (1985).

SUMMARY

Technical Problem

In the course of studying the mass production method of the scanning antenna described in PTL 6, warping may occur in a slot substrate of a prototyped scanning antenna. If the warping of the substrate is large, problems such as conveyance troubles, chipping of the substrate, or cracking of the substrate may occur in the mass production process. An object of the disclosure is to provide a method for manufacturing a scanning antenna capable of improving mass productivity of a scanning antenna and a scanning antenna having excellent mass productivity.

Solution to Problem

A method for manufacturing a scanning antenna according to an embodiment of the disclosure is a method for manufacturing a scanning antenna with a plurality of antenna units arrayed in the scanning antenna, the scanning antenna including a TFT substrate including a first dielectric substrate, a plurality of TFTs supported by the first dielectric substrate, a plurality of gate bus lines, a plurality of source bus lines, and a plurality of patch electrodes, each patch electrode being electrically connected to a drain electrode of a corresponding TFT of the plurality of TFTs, a slot substrate including a second dielectric substrate and a slot electrode being formed on a first main surface of the second dielectric substrate and including a plurality of slots disposed corresponding to the plurality of patch electrodes, a liquid crystal layer provided between the TFT substrate and the slot substrate, and a reflective conductive plate disposed to face a second main surface of the second dielectric substrate on a side opposite to the first main surface with a dielectric layer interposed between the reflective conductive plate and the second main surface, the method including: a step (a) of depositing a first conductive film containing copper on the first main surface of the second dielectric substrate; a step (b) of, after the step (a), bringing the first conductive film into contact with an atmosphere to form an oxide film on a surface of the first conductive film; and a step (c) of, after the step (b), depositing a second conductive film containing copper on the oxide film.

In an embodiment, the step (b) is performed such that a temperature of the second dielectric substrate is less than or equal to 60° C. The step (b) may be performed such that the temperature of the second dielectric substrate is less than or equal to 40° C.

In an embodiment, the step (b) includes a step of taking out the second dielectric substrate and the first conductive film from a chamber in which the first conductive film has been deposited in the step (a).

In an embodiment, the step (a) is performed such that the temperature of the second dielectric substrate does not exceed 130° C.

In an embodiment, a thickness of the first conductive film deposited in the step (a) is less than or equal to 2 µm.

In an embodiment, the step (b) includes a step of leaving the second dielectric substrate and the first conductive film for one minute or longer outside the chamber in which the first conductive film has been deposited in the step (a).

In an embodiment, a copper content rate in the first conductive film deposited in the step (a) is greater than or equal to 95 mass %.

In an embodiment, the method further includes a step of, prior to the step (a), depositing a lower conductive film containing titanium on the first main surface of the second dielectric substrate.

In an embodiment, the method further includes a step (d) of, after the step (c), bringing the second conductive film into contact with the atmosphere to form a further oxide film on a surface of the second conductive film; and a step (e) of, after the step (d), depositing a third conductive film containing copper on the further oxide film.

A scanning antenna according to an embodiment of the disclosure is a scanning antenna with a plurality of antenna units arrayed in the scanning antenna, the scanning antenna including: a TFT substrate including a first dielectric substrate, a plurality of TFTs supported by the first dielectric substrate, a plurality of gate bus lines, a plurality of source bus lines, and a plurality of patch electrodes, each patch electrode being electrically connected to a drain electrode of a corresponding TFT of the plurality of TFTs; a slot substrate including a second dielectric substrate and a slot electrode being formed on a first main surface of the second dielectric substrate and including a plurality of slots disposed corresponding to the plurality of patch electrodes; a liquid crystal layer provided between the TFT substrate and the slot substrate; and a reflective conductive plate disposed to face a second main surface of the second dielectric substrate on a side opposite to the first main surface with a dielectric layer interposed between the reflective conductive plate and the second main surface, wherein the slot electrode includes a first conductive layer containing copper, an oxide layer formed on the first conductive layer, containing copper oxide, and having a thickness of less than or equal to 5 nm, and a second conductive layer formed on the oxide layer and containing copper.

In an embodiment, the slot electrode further includes a lower conductive layer containing titanium under the first conductive layer.

In an embodiment, a thickness of the first conductive layer is less than or equal to 2 μm.

In an embodiment, a copper content rate of the first conductive layer is greater than or equal to 95 mass %.

In an embodiment, the slot electrode further includes a further oxide layer formed on the second conductive layer, containing copper oxide, and having a thickness of less than or equal to 5 nm, and a third conductive layer formed on the further oxide layer and containing copper.

Advantageous Effects of Disclosure

According to the embodiment of the disclosure, provided are a method for manufacturing a scanning antenna capable of improving mass productivity of a scanning antenna and a scanning antenna having excellent mass productivity.

DESCRIPTION OF EMBODIMENTS

Figure 1:
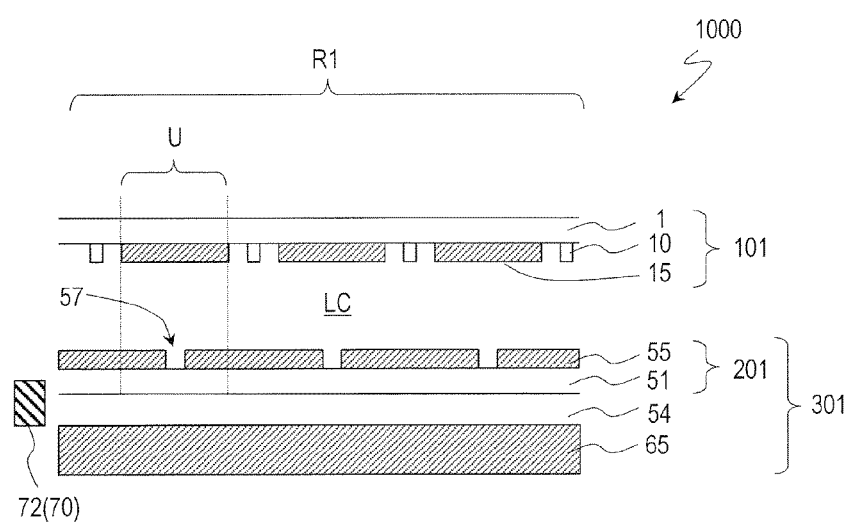
FIG. 1 is a cross-sectional view schematically illustrating a portion of a scanning antenna 1000 according to an embodiment of the disclosure.

Hereinafter, a scanning antenna and a method for manufacturing a scanning antenna according to embodiments of the disclosure will be described with reference to the drawings. Note that the disclosure is not limited to the embodiments illustrated below. The embodiments of the disclosure are not limited to the drawings. For example, a thickness of a layer in a cross-sectional view, sizes of a conductive portion and an opening in the plan view, and the like are exemplary.

Basic Structure of Scanning Antenna

By controlling the voltage applied to each liquid crystal layer of each antenna unit corresponding to the pixels of the LCD panel and changing the effective dielectric constant M ($\varepsilon_M$) of the liquid crystal layer for each antenna unit, a scanning antenna equipped with an antenna unit that uses the anisotropy (birefringence index) of a large dielectric constant M ($\varepsilon_M$) of a liquid crystal material forms a two-dimensional pattern by antenna units with different electrostatic capacitances (corresponding to displaying of an image by an LCD). An electromagnetic wave (for example, a microwave) emitted from an antenna or received by an antenna is given a phase difference depending on the electrostatic capacitance of each antenna unit, and gains a strong directivity in a particular direction depending on the two-dimensional pattern formed by the antenna units having different electrostatic capacitances (beam scanning). For example, an electromagnetic wave emitted from an antenna is obtained by integrating, with consideration for the phase difference provided by each antenna unit, spherical waves obtained as a result of input electromagnetic waves entering each antenna unit and being scattered by each antenna unit. It can be considered that each antenna unit functions as a "phase shifter." For a description of the basic structure and operating principles of a scanning antenna that uses a liquid crystal material, refer to PTL 1 to PTL 4 as well as NPL 1 and NPL 2. NPL 2 discloses the basic structure of a scanning antenna in which spiral slots are arranged. For reference, the entire contents of the disclosures of PTL 1 to PTL 4 as well as NPL 1 and NPL 2 are incorporated herein.

Note that although the antenna units in the scanning antenna according to the embodiments of the disclosure are similar to the pixels of the LCD panel, a structure of the antenna units is different from the structure of the pixel of the LCD panel, and an array of the plurality of antenna units is also different from an array of the pixels in the LCD panel. A basic structure of the scanning antenna according to the embodiments of the disclosure will be described with reference to FIG. 1, which illustrates a scanning antenna 1000 of a first embodiment to be described in detail later. Although the scanning antenna 1000 is a radial in-line slot antenna in which slots are concentrically arranged, the scanning antennas according to the embodiments of the disclosure are not limited to this. For example, the arrangement of the slots may be any of various known arrangements. In particular, with respect to the slot and/or antenna unit arrangements, the entire disclosure of PTL 5 is incorporated herein by reference.

FIG. 1 is a cross-sectional view schematically illustrating a portion of the scanning antenna 1000 of the present embodiment, and schematically illustrates a part of the cross-section along the radial direction from a power feed pin 72 (see FIG. 2(b)) provided near the center of the concentrically arranged slots.

The scanning antenna 1000 includes a TFT substrate 101, a slot substrate 201, a liquid crystal layer LC provided therebetween, and a reflective conductive plate 65 opposing the slot substrate 201 with an air layer 54 interposed between the slot substrate 201 and the reflective conductive plate 65. The scanning antenna 1000 transmits and/or receives microwaves to and/or from a side closer to the TFT substrate 101.

The TFT substrate 101 includes a dielectric substrate 1 such as a glass substrate, a plurality of patch electrodes 15 and a plurality of TFTs 10 formed on the dielectric substrate 1. Each patch electrode 15 is connected to a corresponding TFT 10. Each TFT 10 is connected to a gate bus line and a source bus line.

The slot substrate 201 includes a dielectric substrate 51 such as a glass substrate and a slot electrode 55 formed on a side of the dielectric substrate 51 closer to the liquid crystal layer LC. The slot electrode 55 includes a plurality of slots 57.

The reflective conductive plate 65 is disposed opposing the slot substrate 201 with the air layer 54 interposed between the reflective conductive plate 65 and the slot substrate 201. In place of the air layer 54, a layer formed of a dielectric (for example, a fluorine resin such as PTFE) having a small dielectric constant M for microwaves can be used. The slot electrode 55, the reflective conductive plate 65, and the dielectric substrate 51 and the air layer 54 therebetween function as a waveguide 301.

Figure 13:
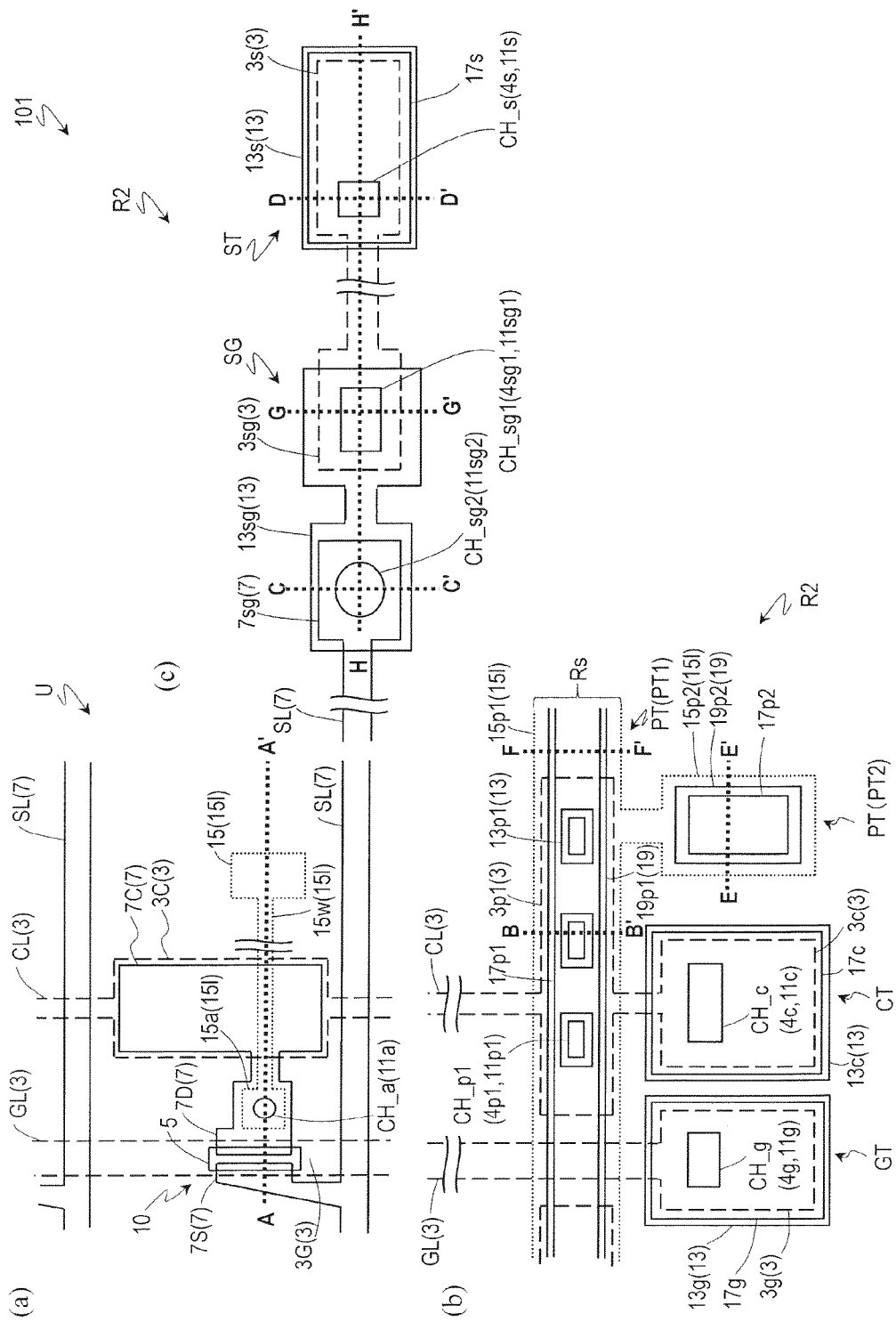
FIG. 13(a) is a schematic plan view of an antenna unit region in a transmission and/or reception region of the TFT substrate 101.
FIGS. 13(b) and 13(c) are schematic plan views of non-transmission and/or reception region of the TFT substrate 101.

The patch electrode 15, the portion of the slot electrode 55 including the slot 57, and the liquid crystal layer LC therebetween constitute an antenna unit U. In each antenna unit U, one patch electrode 15 is opposed to a portion of the slot electrode 55 including one slot 57 with a liquid crystal layer LC interposed therebetween, thereby constituting the liquid crystal capacitance. Each antenna unit U includes an auxiliary capacitance electrically connected in parallel with the liquid crystal capacitance (see FIG. 13). The antenna unit U of the scanning antenna 1000 and a pixel of the LCD panel have a similar configuration. However, the scanning antenna 1000 has many differences from the LCD panel.

First, the performance required for the dielectric substrates 1 and 51 of the scanning antenna 1000 is different from the performance required for the substrate of the LCD panel.

Generally, transparent substrates that are transparent to visible light are used for LCD panels. For example, glass substrates or plastic substrates are used. In reflective LCD panels, since the substrate on the back side does not need transparency, a semiconductor substrate may be used in some cases. In contrast to this, it is preferable for the dielectric substrates 1 and 51 used for the antennas to have small dielectric losses with respect to microwaves (where the dielectric tangent with respect to microwaves is denoted as $\tan \delta_M$). The $\tan \delta_M$ of each of the dielectric substrates 1 and 51 is preferably approximately less than or equal to 0.03, and more preferably less than or equal to 0.01. Specifically, a glass substrate or a plastic substrate can be used. Glass substrates are superior to plastic substrates with respect to dimensional stability and heat resistance, and are suitable for forming circuit elements such as TFTs, a wiring line, and electrodes using LCD technology. For example, in a case where the materials forming the waveguide are air and glass, as the dielectric loss of glass is greater, from the viewpoint that thinner glass can reduce the waveguide loss, it is preferable for the thickness to be less than or equal to 400 μm, and more preferably less than or equal to 300 μm. There is no particular lower limit, provided that the glass can be handled such that it does not break in the manufacturing process.

The conductive material used for the electrode is also different. In many cases, an ITO film is used as a transparent conductive film for pixel electrodes and counter electrodes of LCD panels. However, ITO has a large $\tan \delta_M$ with respect to microwaves, and as such cannot be used as the conductive layer in an antenna. The slot electrode 55 functions as a wall for the waveguide 301 together with the reflective conductive plate 65. Accordingly, to suppress the transmission of microwaves in the wall of the waveguide 301, it is preferable that the thickness of the wall of the waveguide 301, that is, the thickness of the metal layer (Cu layer or Al layer) be large. It is known that in a case where the thickness of the metal layer is three times the skin depth, electromagnetic waves are attenuated to 1/20 (−26 dB), and in a case where the thickness is five times the skin depth, electromagnetic waves are attenuated to about 1/150 (−43 dB). Accordingly, in a case where the thickness of the metal layer is five times the skin depth, the transmittance of electromagnetic waves can be reduced to 1%. For example, for a microwave of 10 GHz, in a case where a Cu layer having a thickness of greater than or equal to 3.3 μm and an Al layer having a thickness of greater than or equal to 4.0 μm are used, microwaves can be reduced to 1/150. In addition, for a microwave of 30 GHz, in a case where a Cu layer having a thickness of greater than or equal to 1.9 μm and an Al layer having a thickness of greater than or equal to 2.3 μm are used, microwaves can be reduced to 1/150. In this way, the slot electrode 55 is preferably formed of a relatively thick Cu layer or Al layer. There is no particular upper limit for the thickness of the Cu layer or the Al layer, and the thicknesses can be set appropriately in consideration of the time and cost of film formation. The usage of a Cu layer provides the advantage of being thinner than the case of using an Al layer. Relatively thick Cu layers or Al layers can be formed not only by the thin film deposition method used in LCD manufacturing processes, but also by other methods such as bonding Cu foil or Al foil to the substrate. The thickness of the metal layer, for example, ranges from 2 μm to 30 μm. In a case where the thin film deposition methods are used, the thickness of the metal layer is preferably less than or equal to 5 μm.

Since the reflective conductive plate 65 constitutes the wall of the waveguide 301, it is desirable that the reflective conductive plate 65 has a thickness that is three times or greater than the skin depth, and preferably five times or greater. An aluminum plate, a copper plate, or the like having a thickness of several millimeters manufactured by, for example, a cutting out process can be used as the reflective conductive plate 65.

Since the patch electrode 15 does not configure the waveguide 301 like the slot electrode 55, a Cu layer or an Al layer can be used that has a smaller thickness than that of the slot electrode 55. However, to avoid losses caused by heat when the oscillation of free electrons near the slot 57 of the slot electrode 55 induces the oscillation of the free electrons in the patch electrode 15, it is preferable that the resistance be low. From the viewpoint of mass production, it is preferable to use an Al layer rather than a Cu layer, and the thickness of the Al layer is preferably greater than or equal to 0.3 μm and less than or equal to 2 μm, for example.

In addition, an arrangement pitch of the antenna units U is considerably different from that of a pixel pitch. For example, considering an antenna for microwaves of 12 GHz (Ku band), the wavelength λ is 25 mm, for example. Then, as described in PTL 4, since the pitch of the antenna unit U is less than or equal to 214 and/or less than or equal to λ/5, the pitch becomes less than or equal to 6.25 mm and/or less than or equal to 5 mm. This is ten times greater than the pixel pitch of the LCD panel. Accordingly, the length and width of the antenna unit U are also roughly ten times greater than the pixel length and width of the LCD panel.

Of course, the array of the antenna units U may be different from the array of the pixels in the LCD panel. Herein, although an example is illustrated in which the antenna units U are arrayed in concentric circles (for example, refer to JP 2002-217640 A), the present disclosure is not limited thereto, and the antenna units may be arrayed in a spiral shape as described in NPL 2, for example. Furthermore, the antenna units may be arrayed in a matrix as described in PTL 4.

The properties required for the liquid crystal material of the liquid crystal layer LC of the scanning antenna 1000 are different from the properties required for the liquid crystal material of the LCD panel. In the LCD panel, a change in a refractive index of the liquid crystal layer of the pixels allows a phase difference to be provided to the polarized visible light (wavelength of from 380 nm to 830 nm) such that the polarization state is changed (for example, the change in the refractive index allows the polarization axis direction of linearly polarized light to be rotated or the degree of circular polarization of circularly polarized light to be changed), whereby display is performed. In contrast, in the scanning antenna 1000 according to the embodiment, the phase of the microwave excited (re-radiated) from each patch electrode is changed by changing the electrostatic capacitance value of the liquid crystal capacitance of the antenna unit U. Accordingly, the liquid crystal layer preferably has a large anisotropy ($\Delta\varepsilon_M$) of the dielectric constant M (CM) for microwaves, and tan $\delta_M$ is preferably small. For example, the $\Delta\varepsilon_M$ of greater than or equal to 4 and tan $\delta_M$ of less than or equal to 0.02 (values of 19 GHz in both cases) described in SID 2015 DIGEST pp. 824-826 written by M. Wittek et al, can be suitably used. In addition, it is possible to use a liquid crystal material having a $\Delta\varepsilon_M$ of greater than or equal to 0.4 and tan $\delta_M$ of less than or equal to 0.04 as described in POLYMERS 55 vol. August issue pp. 599-602 (2006), written by Kuki.

In general, the dielectric constant of a liquid crystal material has a frequency dispersion, but the dielectric anisotropy $\Delta\varepsilon_M$ for microwaves has a positive correlation with the refractive index anisotropy $\Delta n$ with respect to visible light. Accordingly, it can be said that a material having a large refractive index anisotropy $\Delta n$ with respect to visible light is preferable as a liquid crystal material for an antenna unit for microwaves. The refractive index anisotropy $\Delta n$ of the liquid crystal material for LCDs is evaluated by the refractive index anisotropy for light having a wavelength of 550 nm. Here again, when a $\Delta n$ (birefringence index) is used as an index for light having a wavelength of 550 nm, a nematic liquid crystal having a $\Delta n$ of greater than or equal to 0.3, preferably greater than or equal to 0.4, can be used for an antenna unit for microwaves. $\Delta n$ has no particular upper limit. However, since liquid crystal materials having a large $\Delta n$ tend to have a strong polarity, there is a possibility that reliability may decrease. The thickness of the liquid crystal layer is, for example, from 1 μm to 500 μm.

Hereinafter, the structure and manufacturing method of the scanning antenna according to the embodiments of the disclosure will be described in more detail.

Figure 2:
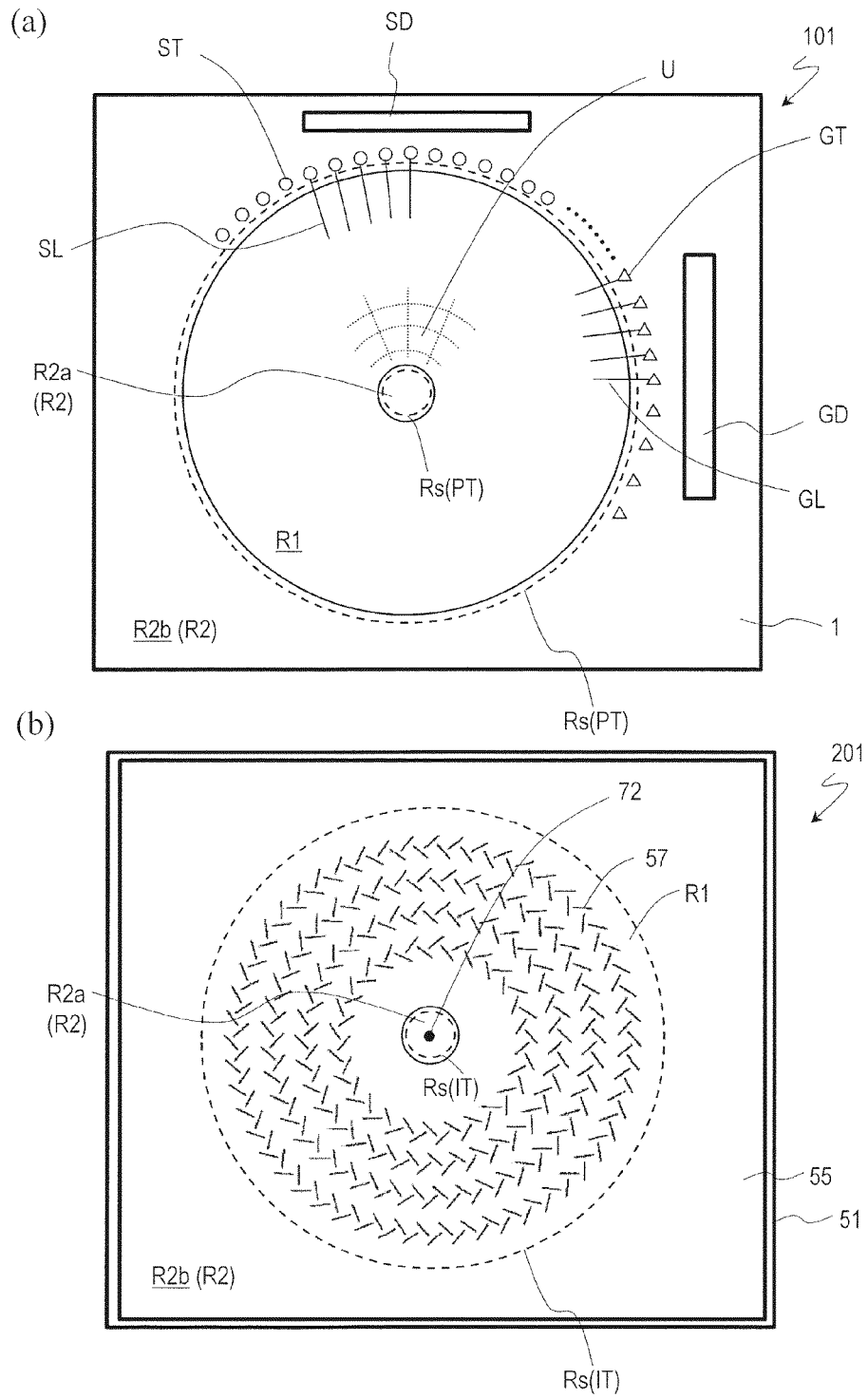
FIGS. 2(a) and 2(b) are schematic plan views illustrating a TFT substrate 101 and a slot substrate 201 included in the scanning antenna 1000, respectively.

First, a description is given with reference to FIG. 1 and FIG. 2. FIG. 1 is a schematic partial cross-sectional view of the scanning antenna 1000 near the center thereof as described above in detail, and FIGS. 2(a) and 2(b) are schematic plan views illustrating the TFT substrate 101 and the slot substrate 201 included in the scanning antenna 1000, respectively.

The scanning antenna 1000 includes a plurality of antenna units U arranged two-dimensionally. In the scanning antenna 1000 exemplified here, the plurality of antenna units are arranged concentrically. In the following description, the region of the TFT substrate 101 and the region of the slot substrate 201 corresponding to the antenna unit U will be referred to as "antenna unit region," and be denoted with the same reference numeral U as the antenna unit. In addition, as illustrated in FIGS. 2(a) and 2(b), in the TFT substrate 101 and the slot substrate 201, a region defined by the plurality of two-dimensionally arranged antenna unit regions is referred to as a "transmission and/or reception region R1," and a region other than the transmission and/or reception region R1 is referred to as a "non-transmission and/or reception region R2." A terminal section, a driving circuit, and the like are provided in the non-transmission and/or reception region R2.

FIG. 2(a) is a schematic plan view illustrating the TFT substrate 101 included in the scanning antenna 1000.

In the illustrated example, the transmission and/or reception region R1 has a donut-shape when viewed from a normal direction of the TFT substrate 101. The non-transmission and/or reception region R2 includes a first non-transmission and/or reception region R2a located at the center of the transmission and/or reception region R1 and a second non-transmission and/or reception region R2b located at the periphery of the transmission and/or reception region R1. An outer diameter of the transmission and/or reception region R1, for example, is from 200 mm to 1500 mm, and is configured according to a communication traffic volume or the like.

A plurality of gate bus lines GL and a plurality of source bus lines SL supported by the dielectric substrate 1 are provided in the transmission and/or reception region R1 of the TFT substrate 101, and the antenna unit regions U are defined by these wiring lines. The antenna unit regions U are, for example, arranged concentrically in the transmission and/or reception region R1. Each of the antenna unit regions U includes a TFT and a patch electrode electrically connected to the TFT. The source electrode of the TFT is electrically connected to the source bus line SL, and the gate electrode is electrically connected to the gate bus line GL. In addition, the drain electrode is electrically connected to the patch electrode.

In the non-transmission and/or reception region R2 (R2a, R2b), a seal region Rs is disposed surrounding the transmission and/or reception region R1. A sealing member (not illustrated) is applied to the seal region Rs. The sealing member bonds the TFT substrate 101 and the slot substrate 201 to each other, and also encloses liquid crystals between these substrates 101, 201.

A gate terminal section GT, the gate driver GD, a source terminal section ST, and the source driver SD are provided outside the seal region Rs in the non-transmission and/or reception region R2. Each of the gate bus lines GL is connected to the gate driver GD with the gate terminal section GT therebetween. Each of the source bus lines SL is connected to the source driver SD with the source terminal section ST therebetween. Note that, in this example, although the source driver SD and the gate driver GD are formed on the dielectric substrate 1, one or both of these drivers may be provided on another dielectric substrate.

Also, a plurality of transfer terminal sections PT are provided in the non-transmission and/or reception region R2. The transfer terminal section PT is electrically connected to the slot electrode 55 (FIG. 2(b)) of the slot substrate 201. In the present specification, the connection section between the transfer terminal section PT and the slot electrode 55 is referred to as a "transfer section." As illustrated in drawings, the transfer terminal section PT (transfer section) may be disposed in the seal region Rs. In this case, a resin containing conductive particles may be used as the sealing member. In this way, liquid crystals are sealed between the TFT substrate 101 and the slot substrate 201, and an electrical connection can be secured between the transfer terminal section PT and the slot electrode 55 of the slot substrate 201. In this example, although a transfer terminal section PT is disposed in both the first non-transmission and/or reception region R2a and the second non-transmission and/or reception region R2b, the transfer terminal section PT may be disposed in only one of them.

Note that the transfer terminal section PT (transfer section) need not be disposed in the seal region Rs. For example, the transfer terminal section PT may be disposed outside the seal region Rs (opposite to the liquid crystal layer) in the non-transmission and/or reception region R2. For example, the transfer terminal section PT may be disposed both within and outside the seal region Rs (opposite to the liquid crystal layer) in the non-transmission and/or reception region R2 (see FIG. 3).

FIG. 2(b) is a schematic plan view illustrating the slot substrate 201 in the scanning antenna 1000, and illustrates the surface of the slot substrate 201 closer to the liquid crystal layer LC.

In the slot substrate 201, the slot electrode 55 is formed on the dielectric substrate 51 extending across the transmission and/or reception region R1 and the non-transmission and/or reception region R2.

In the transmission and/or reception region R1 of the slot substrate 201, a plurality of slots 57 are formed in the slot electrode 55. The slots 57 are formed corresponding to the antenna unit region U on the TFT substrate 101. For the plurality of slots 57 in the illustrated example, a pair of slots 57 extending in directions substantially orthogonal to each other are concentrically arrayed so that a radial in-line slot antenna is configured. Since the scanning antenna 1000 includes slots that are substantially orthogonal to each other, the scanning antenna 1000 can transmit and/or receive circularly polarized waves.

A plurality of terminal sections IT of the slot electrode 55 are provided in the non-transmission and/or reception region R2. The terminal section IT is electrically connected to the transfer terminal section PT (FIG. 2(a)) of the TFT substrate 101. In this example, the terminal section IT is disposed within the seal region Rs, and is electrically connected to a corresponding transfer terminal section PT by a sealing member containing conductive particles.

In addition, the power feed pin 72 is disposed on a back face side of the slot substrate 201 in the first non-transmission and/or reception region R2a. The power feed pin 72 allows microwaves to be inserted into the waveguide 301 constituted by the slot electrode 55, the reflective conductive plate 65, and the dielectric substrate 51. The power feed pin 72 is connected to a power feed device 70. Power feeding is performed from the center of the concentric circle in which the slots 57 are arrayed. The power feed method may be either a direct coupling power feed method or an electromagnetic coupling method, and a known power feed structure can be utilized.

In FIGS. 2(a) and 2(b), an example is illustrated in which the seal region Rs is provided so as to surround a relatively narrow region including the transmission and/or reception region R1, but the arrangement of the seal region Rs is not limited to this. In particular, the seal region Rs provided outside the transmission and/or reception region R1 may be provided nearby the side of the dielectric substrate 1 and/or the dielectric substrate 51, for example, so as to maintain a certain distance or more from the transmission and/or reception region R1. Of course, the terminal section and the driving circuit, for example, that are provided in the non-transmission and/or reception region R2 may be formed outside the seal region Rs (that is, the side where the liquid crystal layer is not present). By forming the seal region Rs at a position separated from the transmission and/or reception region R1 by a certain distance or more, it is possible to prevent the antenna characteristics from deteriorating due to the influence of impurities (in particular, ionic impurities) contained in the sealing member (in particular, a curable resin).

Structure of Slot Substrate

The structure of the slot substrate 201 will be described in greater detail with reference to FIG. 3 and FIG. 4.

Figure 3:
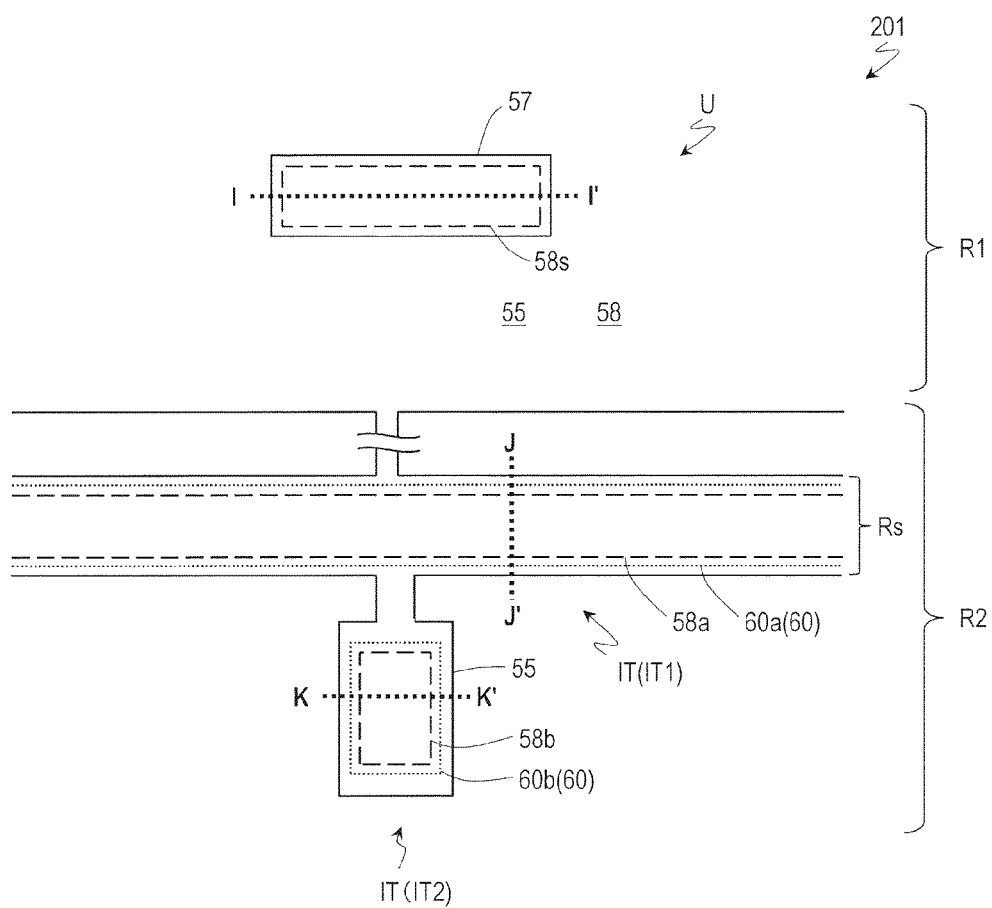
FIG. 3 is a schematic plan view of the slot substrate 201.

FIG. 3 is a schematic plan view of the slot substrate 201, illustrating a schematic plan view of the antenna unit region U in the transmission and/or reception region R1 of the slot substrate 201 and a schematic plan view of the non-transmission and/or reception region R2 of the slot substrate 201. FIG. 4(a) is a schematic cross-sectional view along a line I-I' in FIG. 3, FIG. 4(b) is a schematic cross-sectional view along a line J-J' in FIG. 3, and FIG. 4(c) is a schematic cross-sectional view along a line K-K' in FIG. 3.

Figure 4:
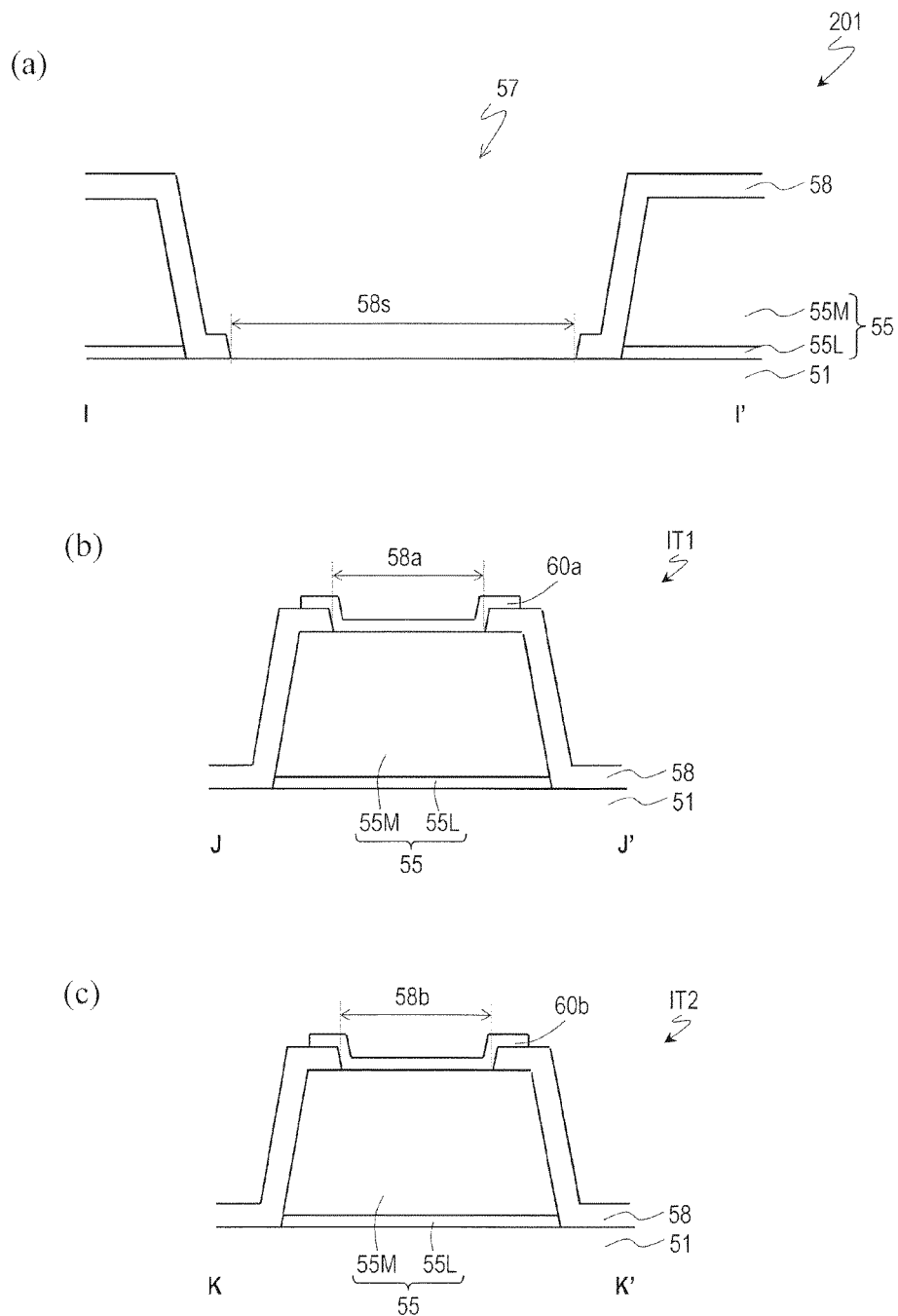
FIGS. 4(a) to 4(c) are schematic cross-sectional views of the slot substrate 201.

As illustrated in FIG. 3 and FIG. 4, the slot substrate 201 includes a dielectric substrate (for example, a glass substrate) 51 having a front face and a back face, a slot electrode 55 formed on the dielectric substrate 51, and an insulating layer 58 covering the slot electrode 55. The slot substrate 201 further includes a transparent conductive layer 60 formed on the insulating layer 58.

The slot electrode 55 includes a plurality of slots 57 in the transmission and/or reception region R1. The slot 57 is an opening that opens through the slot electrode 55. In this example, one slot 57 is disposed in each antenna unit region U.

The slot electrode 55 includes a main layer 55M such as a Cu layer or an Al layer. For example, the slot electrode 55 may have a layered structure that includes the main layer 55M, as well as an upper layer and/or a lower layer disposed sandwiching the main layer 55M therebetween. The main layer 55M is a low resistance metal layer 55M, which is typically a Cu layer or an Al layer. A thickness of the main layer 55M may be set in consideration of the skin effect depending on the material, and is, for example, greater than or equal to 2 μm and less than or equal to 6 μm. The thickness of the main layer 55M is typically greater than the thicknesses of the upper layer and the lower layer. The upper layer and the lower layer are high melting-point metal containing layers. The thickness of each of the upper layer and the lower layer is, for example, greater than or equal to 10 nm and less than or equal to 300 nm.

For example, in the example illustrated in FIG. 4, the slot electrode 55 includes the main layer 55M and a lower layer 55L disposed below the main layer 55M. In this example, the slot electrode 55 includes a Cu layer 55M (thickness: 3 μm, for example) as the main layer 55M and a Ti layer 55L (thickness: 20 nm, for example) as the lower layer 55L.

When the slot electrode 55 includes a lower layer disposed below the main layer 55M, adhesion between the slot electrode 55 and the glass substrate 51 can be improved. When the slot electrode 55 includes an upper layer disposed on the main layer 55M, corrosion of the main layer 55M (for example, the Cu layer) can be suppressed.

The "low resistance metal layer" is a layer containing at least one element selected from the group consisting of copper (Cu), aluminum (Al), silver (Ag), and gold (Au). The "low resistance metal layer" may have a layered structure. The "high melting-point metal containing layer" is a layer containing at least one element selected from the group consisting of titanium (Ti), tungsten (W), molybdenum (Mo), tantalum (Ta), and niobium (Nb). The "high melting-point metal containing layer" may have a layered structure. For example, the high melting-point metal containing layer refers to a layer formed of any of Ti, W, Mo, Ta, Nb, an alloy containing these, and a nitride of these, and a solid solution of the above metal(s) or alloy and the nitride.

The insulating layer 58 is formed on the slot electrode 55 and within the slot 57. Materials of the insulating layer 58 are not particularly limited, and, for example, silicon oxide ($SiO_2$), silicon nitride ($Si_xN_y$), silicon oxynitride ($SiO_xN_y$; x>y), silicon nitride oxide ($SiN_xO_y$; x>y), or the like can be used as appropriate. In a case where the slot electrode 55 is formed of a Cu layer, Cu may elute into the liquid crystal layer LC in some cases. By covering the slot electrode 55 with the insulating layer 58, the slot electrode 55 and the liquid crystal layer LC are not in direct contact with each other, such that the reliability can be enhanced. In addition, in a case where the slot electrode 55 is formed of an Al layer by using a thin film deposition technique, the Al layer may include a void. The insulating layer 58 can prevent the liquid crystal material from entering the void of the Al layer. Note that in a case where the slot electrode 55 is formed by bonding an aluminum foil to the dielectric substrate 51 with an adhesive to form the Al layer and patterning the formed Al layer, the problem of voids can be avoided.

As illustrated in FIG. 3 and FIG. 4(a), in this example, the insulating layer 58 includes an opening 58s within the slot 57 of the antenna unit region U. The insulating layer 58 is formed to cover substantially an entire surface of the transmission and/or reception region R1, except for the opening 58s. The insulating layer 58 is preferably formed to cover an upper face and a side surface(s) of the slot electrode 55 in order to suppress elution of the metal (for example, Cu) from the slot electrode 55 into the liquid crystal layer LC. Note that the opening 58s may be omitted. That is, the insulating layer 58 may be formed over the entire transmission and/or reception region R1.

Figure 5:
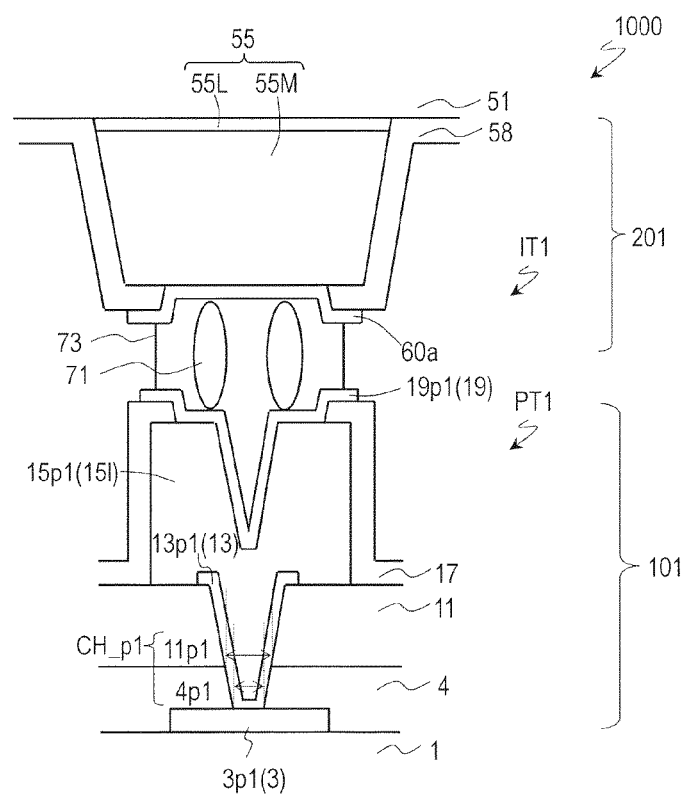
FIG. 5 is a schematic cross-sectional view for describing a transfer section of the scanning antenna 1000.

As illustrated in FIG. 3, the terminal sections IT are provided in the non-transmission and/or reception region R2 of the slot substrate 201. As illustrated in FIG. 5, the terminal section IT is electrically connected to the transfer terminal section PT of the TFT substrate 101. The terminal section IT of the slot substrate 201 and the transfer terminal section PT of the TFT substrate 101 constitute the transfer section. FIG. 5 is a schematic cross-sectional view for describing the transfer section including a first transfer terminal section PT1 of the TFT substrate 101 and a terminal section IT1 of the slot substrate 201.

In the example illustrated in FIG. 3, the terminal section IT includes a first terminal section IT1 located in the seal region Rs and a second terminal section IT2 provided outside the seal region Rs (on a side where the liquid crystal layer is not present). In the illustrated example, the first terminal section IT1 extends along the seal region Rs to surround the transmission and/or reception region R1.

As illustrated in FIG. 3, and FIGS. 4(b) and 4(c), the insulating layer 58 includes openings 58a and 58b in the first terminal section IT1 and the second terminal section IT2, respectively, in the non-transmission and/or reception region R2. The insulating layer 58 is formed to cover substantially an entire surface of the non-transmission and/or reception region R2, except for the openings 58a and 58b. The first terminal section IT1 includes an upper connection section 60a formed on the insulating layer 58 and within the opening 58a, and the second terminal section IT2 includes an upper connection section 60b formed on the insulating layer 58 and within the opening 58b. The slot electrode 55 is exposed within the openings 58a and 58b of the insulating layer 58, and the upper connection sections 60a and 60b are in contact with the slot electrode 55 within the openings 58a and 58b, respectively. The upper connection sections 60a and 60b are included in the transparent conductive layer 60. For example, an ITO (indium tin oxide) layer, or an IZO (indium zinc oxide) layer or a ZnO (zinc oxide) layer can be used as the transparent conductive layer 60. A thickness of the transparent conductive layer 60 is set so that a sheet resistance is less than 100 Ω/sq, for example. The thickness of the transparent conductive layer 60 is, for example, greater than or equal to 20 nm and less than or equal to 250 nm.

Figure 14:
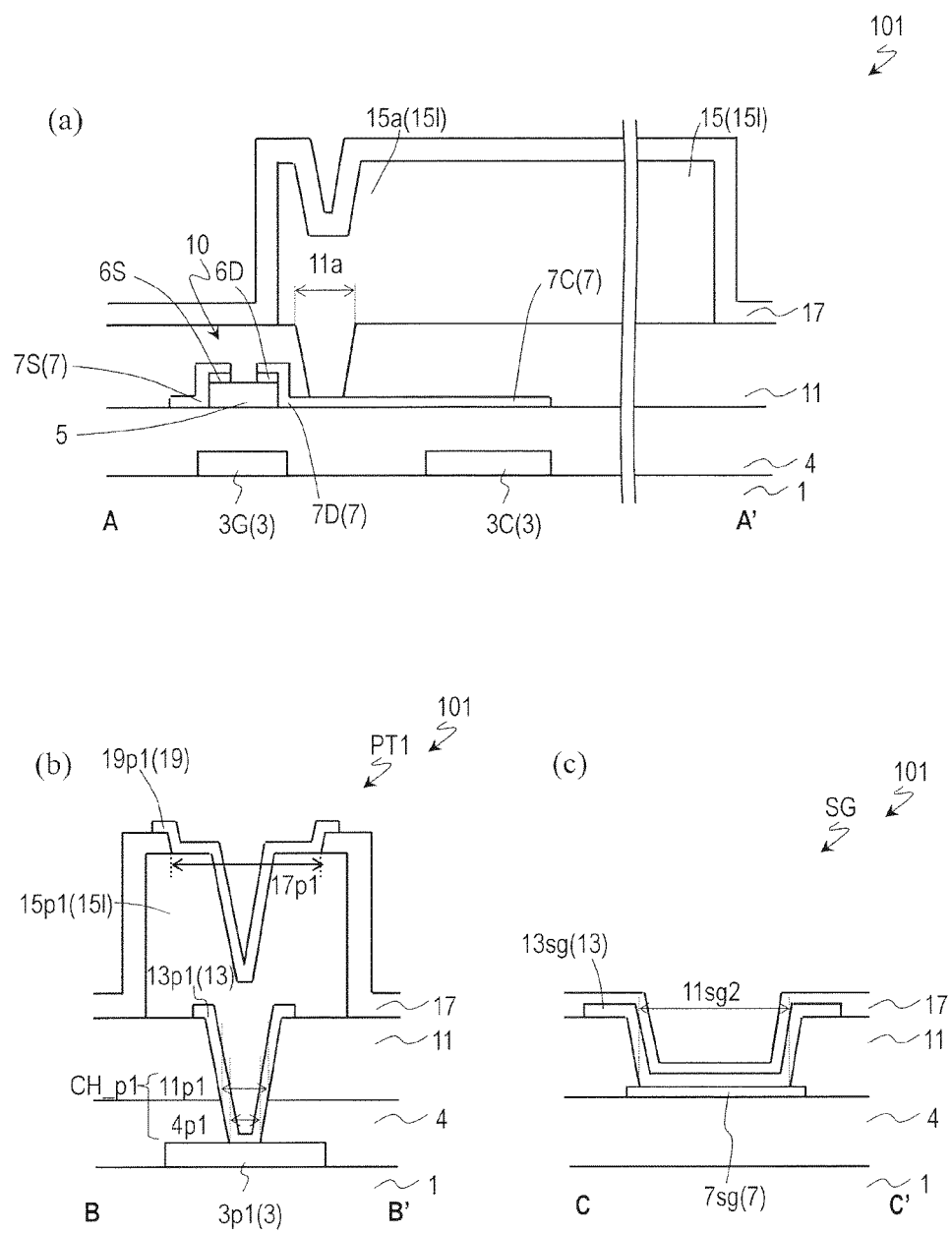
FIGS. 14(a) to 14(c) are schematic cross-sectional views of the TFT substrate 101.

As illustrated in FIG. 5, in the transfer section, the upper connection section 60a of the first terminal section IT1 is electrically connected to a first transfer terminal upper connection section 19p1 of the first transfer terminal section PT1 in the TFT substrate 101. In this example, the upper connection section 60a is connected to the upper connection section 19p1 with a resin (sealing resin) 73 (also referred to as a sealing portion 73) including conductive beads 71 interposed therebetween. Note that the details of the structure of the first transfer terminal section PT1 of the TFT substrate 101 will be described later with reference to FIG. 14(b).

Figure 15:
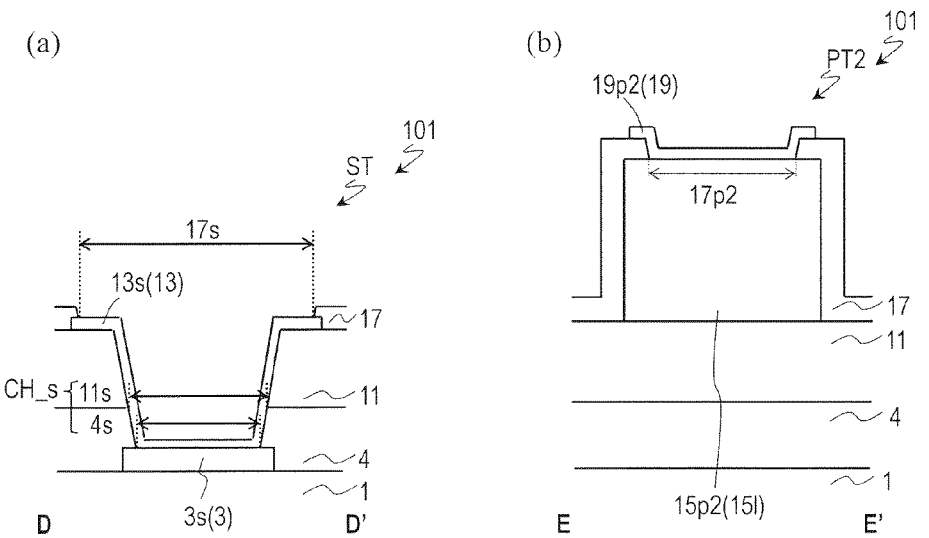
FIGS. 15(a) to 15(d) are schematic cross-sectional views of the TFT substrate 101.
Figure 15:
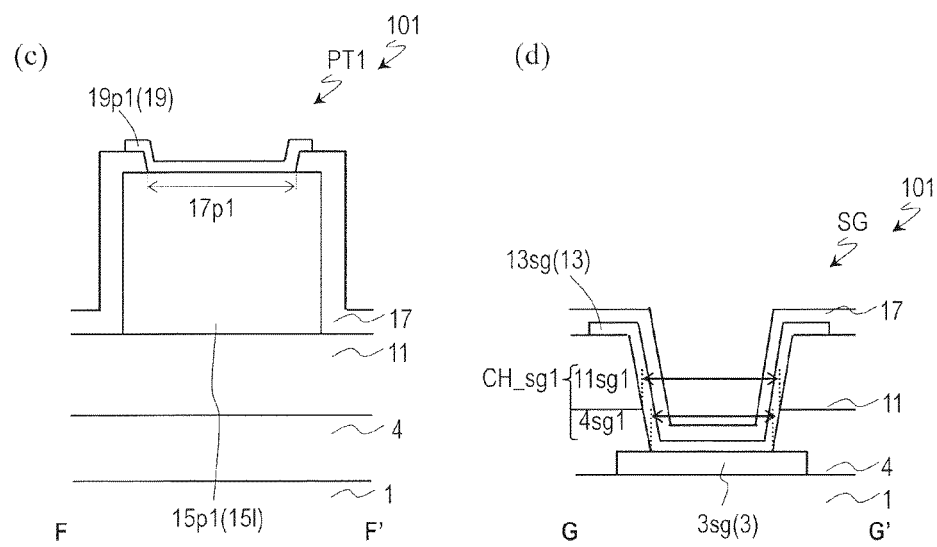

In the second terminal section IT2 also, the upper connection section 60b may be connected to a second transfer terminal upper connection section 19p2 (see FIG. 15(b)) of a second transfer terminal section PT2 of the TFT substrate 101 with a sealing member containing conductive particles, for example.

Each of the upper connection sections 60a, 60b, 19p1, and 19p2 is formed of a transparent conductive layer such as an ITO film or an IZO film, and there is a possibility that an oxide film is formed on the surface thereof. When an oxide film is formed, a contact resistance may increase so that the electrical connection via the transparent conductive layers may not be ensured. In contrast, in the present embodiment, since, for example, the upper connection section 60a and the upper connection section 19p1 are bonded (or, the upper connection section 60b and the upper connection section 19p2 are bonded) with the resin including the conductive beads (for example, Au beads) 71 therebetween, even in a case where an oxide film is formed on the surface of the transparent conductive layer, the conductive beads pierce (penetrate) the surface oxide film, allowing an increase in the contact resistance to be suppressed. The conductive beads 71 may penetrate not only the surface oxide film but also the upper connection sections 60a, 60b, 19p1, and 19p2 which are the transparent conductive layers, and directly contact a second conductive portion 15p1 (or a lower connection section 15p2) and the slot electrode 55.

Manufacturing Method of Slot Substrate in Reference Example

A manufacturing method of the slot substrate 201 in a reference example will be described with reference to FIGS. 6(a) to 6(f).

FIGS. 6(a) to 6(f) are schematic cross-sectional views for describing the manufacturing method of the slot substrate 201 in the reference example. Each of these figures illustrates the antenna unit region U (a cross section along a line I-I' in FIG. 3) and the first terminal section IT1 (a cross section along a line J-J' in FIG. 3) of the slot substrate 201. Note that the second terminal section IT2 is formed in the same manner as the first terminal section IT1, although the drawings and descriptions are omitted.

Figure 6:
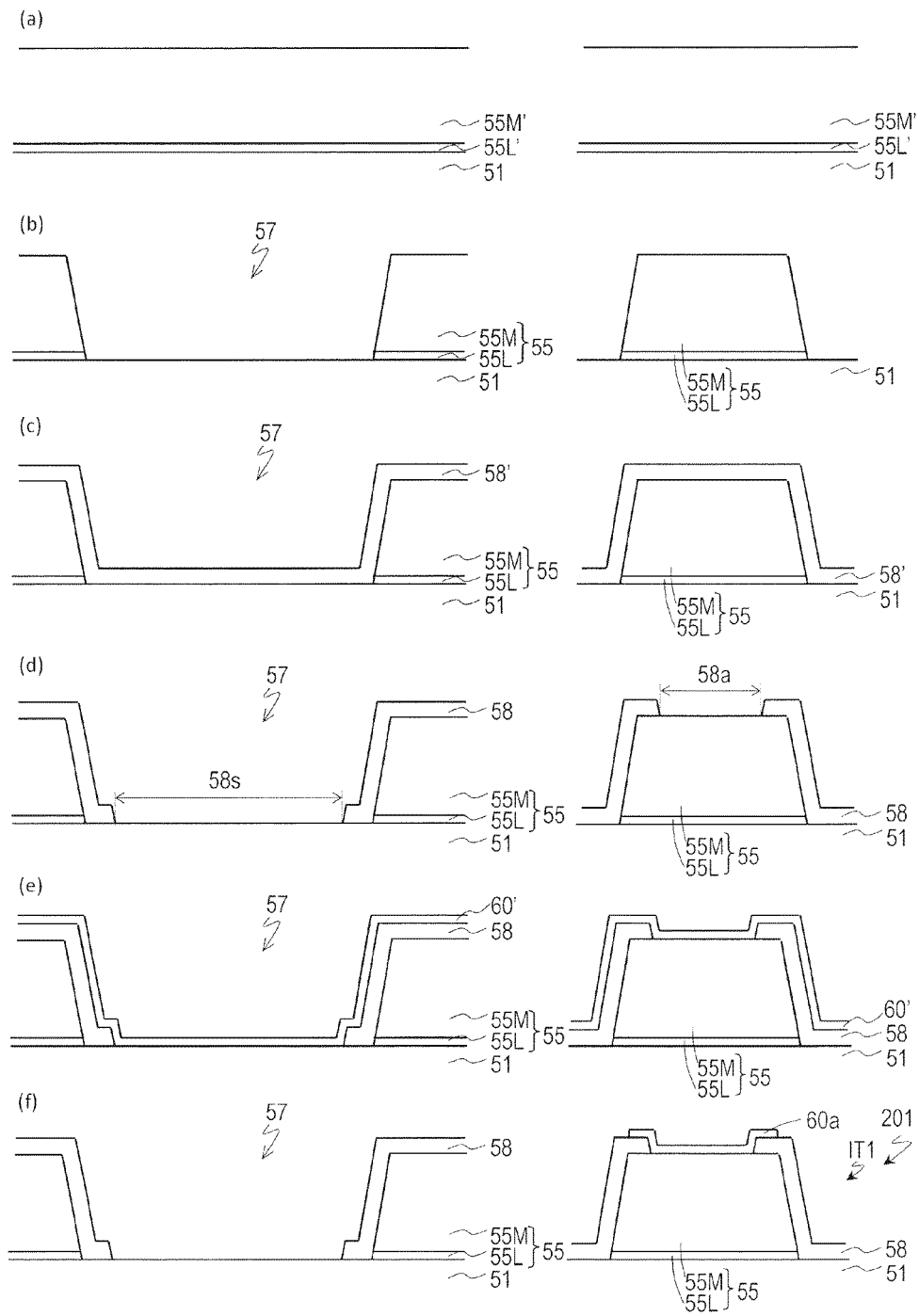
FIGS. 6(a) to 6(f) are schematic cross-sectional views for describing a manufacturing method of a slot substrate in a reference example.

First, as illustrated in FIG. 6(a), a high melting-point metal film 55L' and a low resistance metal film 55M' are deposited in this order on a surface of the dielectric substrate 51 by physical vapor deposition (PVD) such as sputtering or vacuum deposition.

A substrate such as a glass substrate or a resin substrate having a high transmittance to electromagnetic waves (the dielectric constant $\varepsilon_M$ and the dielectric loss tan $\delta_M$ are small) can be used as the dielectric substrate 51. The dielectric substrate 51 is preferably thin in order to suppress the attenuation of the electromagnetic waves. For example, after forming the constituent elements such as the slot electrode 55 on the surface of the glass substrate 51 by a process to be described later, the glass substrate 51 may be thinned from a rear side. This allows a thickness of the glass substrate 51 to be reduced to 500 μm or less, for example.

Here, a glass substrate having a size of 550 mm×650 mm and a thickness of 700 μm, for example, is used as the dielectric substrate 51. Here, as the high melting-point metal film 55L', a Ti film (thickness: 20 nm, for example) is formed on the glass substrate 51, and a Cu film (thickness: 3000 nm, for example) is formed as the low resistance metal film 55M' on the high melting-point metal film 55L'. A high melting-point metal film may be further formed on the low resistance metal film 55M'. For example, a layered film may be formed on the dielectric substrate 51 by layering a Ti film, a Cu film, and a Ti film in this order.

Next, the high melting-point metal film 55L' and the low resistance metal film 55M' are patterned to form the slot electrode 55 having a plurality of slots 57, as illustrated in FIG. 6(b).

After that, as illustrated in FIG. 6(c), an insulating film 58' (thickness: 100 nm or 200 nm, for example) is formed on the slot electrode 55 and within the slots 57. As the insulating film 58', for example, silicon oxide ($SiO_2$) film, a silicon nitride ($Si_xN_y$) film, a silicon oxynitride ($SiO_xN_y$; x>y) film, a silicon nitride oxide ($SiN_xO_y$; x>y) film, or the like may be used as appropriate. Here, as the insulating film 58', a silicon nitride ($Si_xN_y$) film having a thickness of 100 nm, for example, is formed.

After that, the insulating film 58' is patterned to form the insulating layer 58 with the openings 58s and 58a, as illustrated in FIG. 6(d). The opening 58s is formed to be inside the slot 57 when viewed from the normal direction of the dielectric substrate 51. The opening 58a is formed to at least reach the slot electrode 55 in a terminal section formation region.

Next, as illustrated in FIG. 6(e), a transparent conductive film 60' is formed on the insulating layer 58 and within the openings 58s and 58a. Here, an ITO film having a thickness of 70 nm, for example, is formed as the transparent conductive film 60'.

After that, the transparent conductive film 60' is patterned to form the transparent conductive layer 60 having the upper connection section 60a in contact with the slot electrode 55 within the opening 58a, as illustrated in FIG. 6(f).

In this manner, the slot substrate 201 is manufactured.

The inventors of the disclosure manufactured the slot substrate 201 in the manufacturing method in the reference example described above and prototyped the scanning antenna including the slot substrate 201, and then warping occurred in the dielectric substrate 51 of the slot substrate 201 in some cases. If the warping occurs in the dielectric substrate 51, problems such as conveyance troubles, chipping of the substrate, or cracking of the substrate may occur in the manufacturing line. In such a case, the mass productivity of the scanning antenna decreases.

In the manufacturing method of the slot substrate 201 in the reference example, a relatively thick low resistance metal film (e.g., a Cu film having a thickness of 3 μm) 55M' is deposited as the main layer 55M of the slot electrode 55 on the dielectric substrate (e.g., glass substrate) 51 as described above. A time required to form such a Cu film 55M' tends to be long, so a temperature of the dielectric substrate 51 increases for that time. This causes a temperature of the low resistance metal film 55M' to increase also. After the low resistance metal film 55M' is formed, the temperatures of the dielectric substrate 51 and the low resistance metal film 55' are lowered to a room temperature. At this time, for example, due to the difference in thermal expansion coefficients of the dielectric substrate 51 and the low resistance metal film 55', a tensile stress is generated in the low resistance metal film 55M', which causes the dielectric substrate 51 to warp. The higher the temperature during film formation, the greater the thermal stress generated, and thus, a degree of warping of the dielectric substrate 51 is larger. For example, in the step of forming the low resistance metal film 55M', when the temperature of the dielectric substrate 51 (also referred to as "substrate temperature")

exceeds 130° C., the mass productivity of the scanning antenna due to warping in the dielectric substrate 51 significantly decreased.

The problems described above are particularly prone to occur in a case of depositing the low resistance metal film 55M' using sputtering. In general, a kinetic energy of atoms vaporized from a target by sputtering is greater than a kinetic energy of vacuum-vaporized atoms. For this reason, the substrate temperature in sputtering may be higher than in a vacuum vapor deposition technique. The film formed on the substrate by sputtering has an advantage of having high adhesion to the substrate compared to a case where the film is formed by the vacuum vapor deposition technique.

First Manufacturing Method of Slot Substrate

Figure 7:
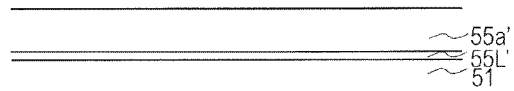
FIGS. 7(a) to 7(d) are schematic cross-sectional views for describing a first manufacturing method of a slot substrate.
Figure 7:
Figure 7:
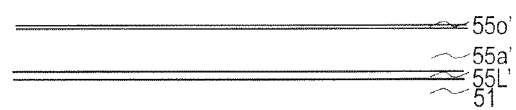
Figure 7:
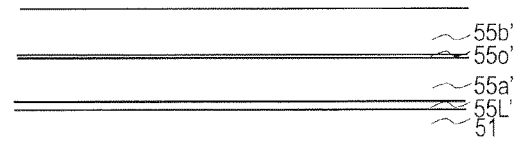
Figure 7:
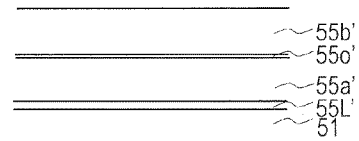
Figure 7:
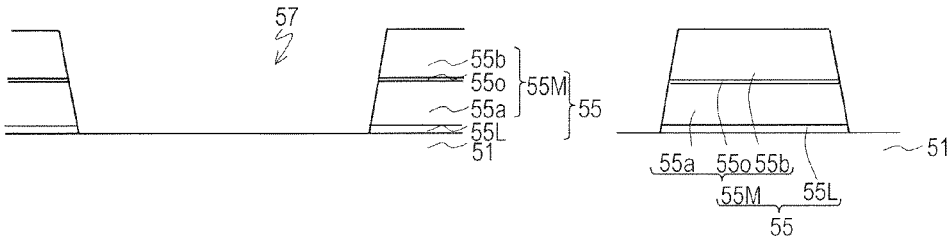
Figure 8:
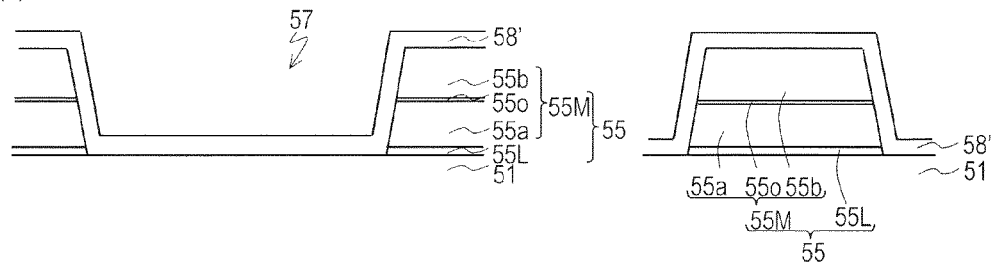
FIGS. 8(a) to 8(d) are schematic cross-sectional views for describing the first manufacturing method of the slot substrate.
Figure 8:
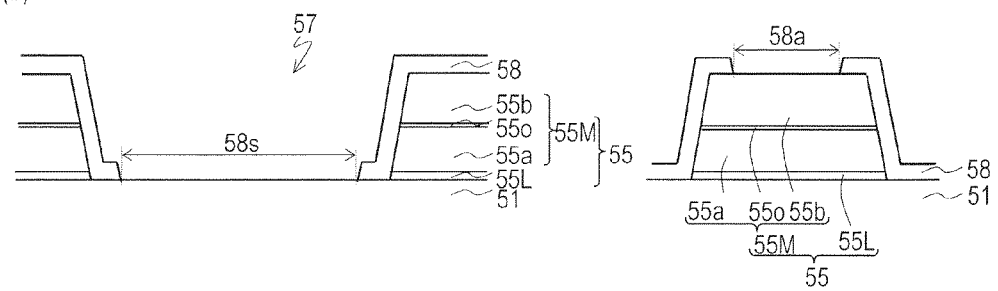
Figure 8:
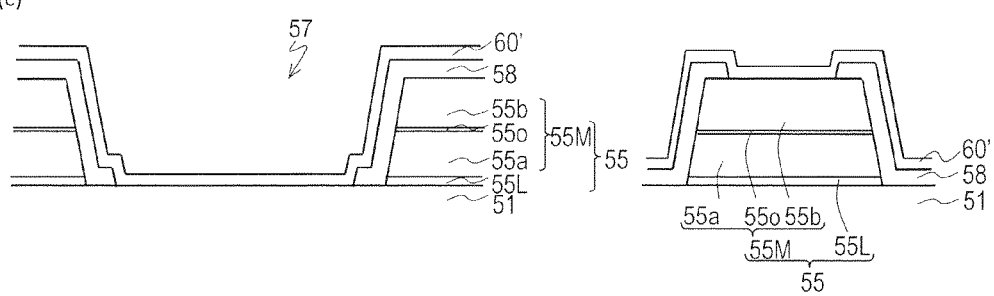
Figure 8:
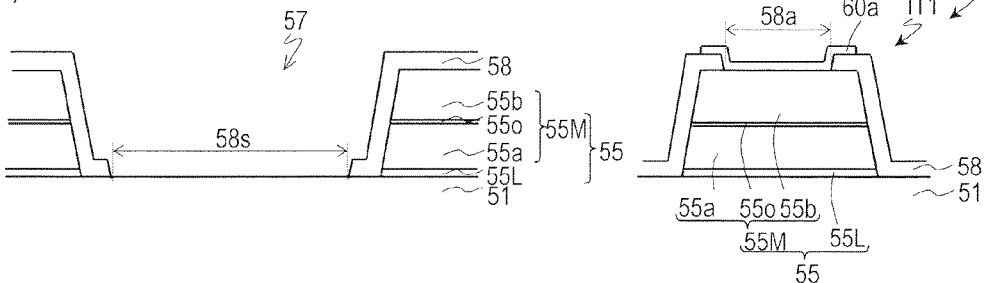

A first manufacturing method of a slot substrate and a structure of a slot substrate 201A manufactured by the first manufacturing method will be described with reference to FIG. 7 and FIG. 8.

According to the first manufacturing method of the slot substrate, the problems described above can be solved. In the first manufacturing method of the slot substrate differs from the manufacturing method in the reference example in including, after depositing a low resistance metal film to form a main layer of a slot electrode, a step of bringing the deposited low resistance metal film into contact with the atmosphere to form a natural oxide film on a surface of the low resistance metal film, and then, a step of further depositing a low resistance metal film on the natural oxide film.

FIGS. 7(a) to 7(d) and FIGS. 8(a) to 8(d) are schematic cross-sectional views for describing the first manufacturing method of the slot substrate 201A. Each of these figures illustrates the antenna unit region U (a cross section along a line I-I' in FIG. 3) and the first terminal section IT1 (a cross section along a line J-J' in FIG. 3) of the slot substrate 201A. Note that, here, a description is given of an exemplary case that the plan view of the slot substrate 201A is the same as the plan view of the slot substrate 201 illustrated in FIG. 3, and thus, the slot substrate 201A may be described with reference to FIG. 3. In the following description, the description may be omitted for steps common to the manufacturing method of the slot substrate 201 in the reference example.

First, as illustrated in FIG. 7(a), a high melting-point metal film 55L' and a low resistance metal film 55a' (also referred to as a "first conductive film 55a'") are deposited on the dielectric substrate 51. Here, the low resistance metal film 55a' is a conductive film 55a' containing copper. The high melting-point metal film 55L' contains titanium, for example. Here, as the high melting-point metal film 55L', a Ti film having a thickness of 20 nm, for example, is deposited, and a Cu film having a thickness of 1500 nm, for example, is deposited as the low resistance metal film 55a' on the high melting-point metal film 55L'.

In the manufacturing method in the reference example, the low resistance metal film 55M' is deposited that has the same thickness as the thickness (greater than or equal to 2 μm and less than or equal to 6 μm; for example, 3 μm) of the main layer 55M of the slot electrode 55 to be formed. In contrast, a thickness of the conductive film 55a' deposited here is less than the thickness of the main layer 55M of the slot electrode 55 to be formed. Here, for example, the conductive film 55a' is deposited that has the thickness approximately half the thickness of the main layer 55M of the slot electrode 55 to be formed. Therefore, in this manufacturing method, an increase in the substrate temperature is suppressed compared to the manufacturing method in the reference example.

The low resistance metal film 55a' may be formed from an alloy containing copper. A content rate of copper in the low resistance metal film 55a' is, for example, greater than or equal to 95 mass %.

After that, the low resistance metal film 55a' is brought into contact with the atmosphere. This reduces the temperatures of the dielectric substrate 51 and the low resistance metal film 55a'. For example, the low resistance metal film 55a' is brought into contact with the atmosphere by opening, to the atmosphere, a chamber where the low resistance metal film 55a' has been deposited (for example, a vacuum level is set to greater than or equal to 90000 Pa). The low resistance metal film 55a' and the dielectric substrate 51 may be taken out of the chamber where the low resistance metal film 55a' has been deposited. In a case where the low resistance metal film 55a' is taken out of the chamber together with the dielectric substrate 51, the substrate temperature can be lowered for a shorter period of time. In a state where the low resistance metal film 55a' is in contact with the atmosphere, the substrate temperature is lowered to 60° C. or lower, for example. In the state where the low resistance metal film 55a' is in contact with the atmosphere, the substrate temperature may be lowered to 40° C. or lower. For example, the low resistance metal film 55a' and the dielectric substrate 51 are left to stand for one minute or more outside the chamber where the low resistance metal film 55a' has been deposited.

Even if the low resistance metal film 55a' is not brought into contact with the atmosphere, that is, the dielectric substrate 51 and the low resistance metal film 55a' are left to stand for a certain amount of time in the chamber in a vacuum state, it is possible to reduce the temperatures of the dielectric substrate 51 and the low resistance metal film 55a' (manufacturing method in another reference example). However, since no medium taking away the temperatures of the dielectric substrate 51 and the low resistance metal film 55a' is in the chamber in the vacuum state, the time is more taken to reduce the temperature and the mass productivity is inferior compared to the case that the low resistance metal film 55a' is brought into contact with the atmosphere.

By bringing the low resistance metal film 55a' into contact with the atmosphere, a natural oxide film 55o' is formed on a surface of the low resistance metal film 55a' as illustrated in FIG. 7(b). The natural oxide film 55o' includes copper oxide ($Cu_2O$ and/or CuO). A thickness of the natural oxide film 55o' is less than or equal to 5 nm. Here, the natural oxide film 55o' having the thickness of approximately 2 nm, for example, is formed.

Because the natural oxide film 55o' is very thin, the low resistance metal films 55a' and 55b' disposed above and below the natural oxide film 55o' are not electrically insulated from each other by the natural oxide film 55o'. Even in a case where the natural oxide film 55o' is formed, the function of the slot electrode 55 as the wall of the waveguide 301 is not substantially affected. The thickness of the natural oxide film 55o' increases with the time elapsed from when the low resistance metal film 55a' comes into contact with the atmosphere, but does not substantially change relative to the elapsed time after a certain period of time (for example, two to three hours in the case of room temperature) has elapsed. An oxidation reaction that forms the natural oxide film 55o' tends to be promoted in a case where the temperature of the low resistance metal film 55a' is high.

Next, as illustrated in FIG. 7(c), a low resistance metal film 55b' (also referred to as a "second conductive film 55b'") is deposited above the low resistance metal film 55a'. Here, the low resistance metal film 55b' is a conductive film 55b' containing copper. The low resistance metal film 55b' is deposited on the natural oxide film 55o' formed on the surface of the low resistance metal film 55a'. Here, a Cu film having a thickness of 1500 nm, for example, is deposited as the low resistance metal film 55b'.

Here, the thickness of the conductive film 55b' deposited is also less than the thickness of the main layer 55M of the slot electrode 55 to be formed. Here, for example, the conductive film 55b' is deposited that has the thickness approximately half the thickness of the main layer 55M of the slot electrode 55 to be formed.

Composition of the low resistance metal film 55b' is substantially the same as the composition of the low resistance metal film 55a', for example. A content rate of copper in the low resistance metal film 55b' is, for example, greater than or equal to 95 mass %.

The deposition of the low resistance metal film 55b' may be performed using the same chamber in which the low resistance metal film 55a' has been deposited, or may be performed using a different chamber.

Next, the high melting-point metal film 55L', the low resistance metal films 55a' and 55b', and the natural oxide film 55o' are patterned to form the slot electrode 55 having a plurality of slots 57, as illustrated in FIG. 7(d). The slot electrode 55 includes, as the main layer 55M, a first conductive layer 55a containing copper, an oxide layer 55o formed on the first conductive layer 55a, containing copper oxide, and having a thickness of less than or equal to 5 nm, and a second conductive layer 55b formed on the oxide layer 55o and containing copper. The slot electrode 55 further includes a lower layer 55L disposed below the main layer 55M.

After that, as illustrated in FIG. 8(a), an insulating film 58' is formed on the slot electrode 55 and within the slots 57. Here, as the insulating film 58', a silicon nitride ($Si_xN_y$) film having a thickness of 100 nm, for example, is formed.

After that, the insulating film 58' is patterned to form an insulating layer 58 with openings 58s and 58a, as illustrated in FIG. 8(b).

Next, as illustrated in FIG. 8(c), a transparent conductive film 60' is formed on the insulating layer 58, within the openings 58s and 58a. Here, an ITO film having a thickness of 70 nm, for example, is formed as the transparent conductive film 60'.

After that, the transparent conductive film 60' is patterned to form the transparent conductive layer 60 having the upper connection section 60a in contact with the slot electrode 55 within the opening 58a, as illustrated in FIG. 8(d).

In this manner, the slot substrate 201A is manufactured.

As illustrated in FIG. 8(d), the slot electrode 55 included in the slot substrate 201A includes, as the main layer 55M, the first conductive layer 55a containing copper, the oxide layer 55o formed on the first conductive layer 55a, containing copper oxide, and having the thickness of less than or equal to 5 nm, and the second conductive layer 55b formed on the oxide layer 55o and containing copper. The slot electrode 55 included in the slot substrate 201A further includes a lower layer 55L disposed below the main layer 55M. The lower layer 55L contains titanium, for example.

The first manufacturing method of the slot substrate includes, after depositing a conductive film containing copper to form a main layer of a slot electrode, a step of bring the deposited conductive film into contact with the atmosphere to form a natural oxide film on a surface of the conductive film, and then, a step of further depositing a conductive film on the natural oxide film, thereby suppressing the increase in the substrate temperature. According to this manufacturing method, warping of the dielectric substrate can be suppressed. According to this manufacturing method, it is possible to improve the mass productivity of the scanning antenna.

PTL 7 discloses a method for manufacturing a planar antenna, the method including a step of forming a first conductive film (for example, a Cu film) on a dielectric substrate by sputtering, a step of forming an intermediate film (e.g., a Cr based thin film) on the first conductive film by sputtering, and a step of forming a second conductive film (e.g. a Cu film) on the intermediate film by sputtering. According to the manufacturing method disclosed in PTL 7, it is described that the occurrence of warping and cracking in the substrate can be suppressed by forming the intermediate film.

The manufacturing method disclosed in PTL 7 includes the step of forming the intermediate film (for example, a Cr based thin film) by sputtering. In contrast, the manufacturing method according to the embodiments of the disclosure includes the step of bring the conductive film containing copper into contact with the atmosphere. This allows the natural oxide film to be formed on the surface of the conductive film. Therefore, the manufacturing method according to the embodiments of the disclosure reduces manufacturing costs compared to the manufacturing method disclosed in PTL 7.

The embodiments of the disclosure are not limited to those illustrated and may be variously modified. The warping of the dielectric substrate and the increase in substrate temperature can be affected by, for example, film formation conditions of the conductive film containing copper, the composition of the conductive film containing copper, the thickness of the conductive film containing copper, the size of the dielectric substrate, and the like.

For example, from the perspective of suppressing the warping of the dielectric substrate, the thickness of the copper-containing conductive film that is deposited in each of the film formation steps is preferably less than or equal to 2 μm and more preferably less than or equal to 1 μm. Each of the respective film formation steps is preferably performed in such a way that the substrate temperature does not exceed 130° C. Here, the "respective film formation steps" refer to the film formation steps performed in the same chamber from when the chamber in which the dielectric substrate is placed is vacuumized prior to depositing the conductive film until the conductive film deposited on the dielectric substrate contacts the atmosphere.

Second Manufacturing Method of Slot Substrate

Figure 9:
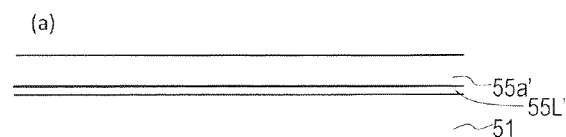
FIGS. 9(a) to 9(f) are schematic cross-sectional views for describing a second manufacturing method of the slot substrate.
Figure 9:
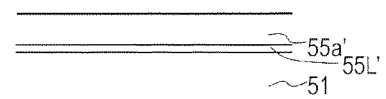
Figure 9:
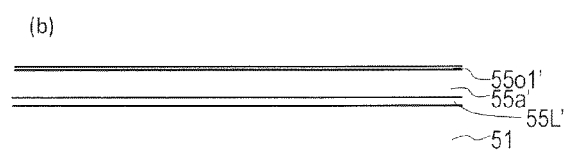
Figure 9:
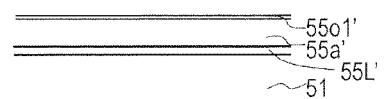
Figure 9:
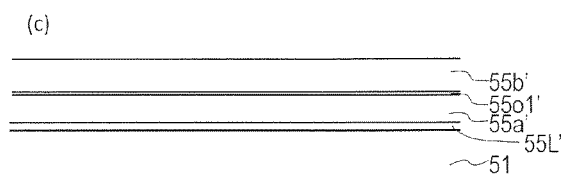
Figure 9:
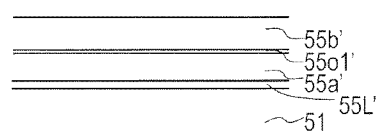
Figure 9:
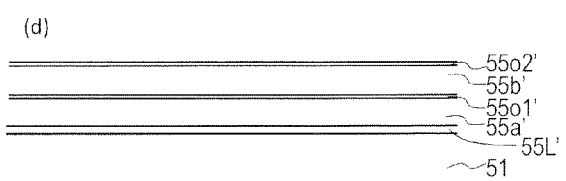
Figure 9:
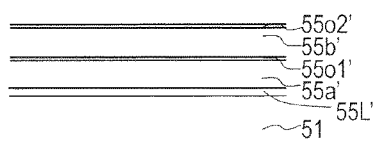
Figure 9:
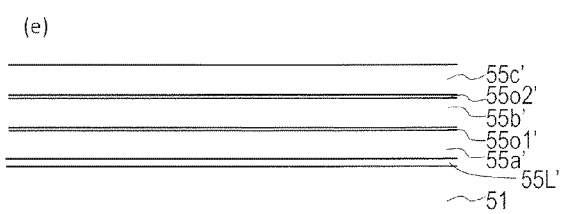
Figure 9:
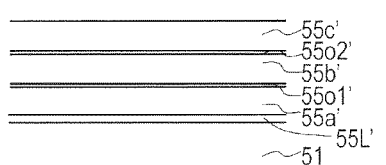
Figure 9:
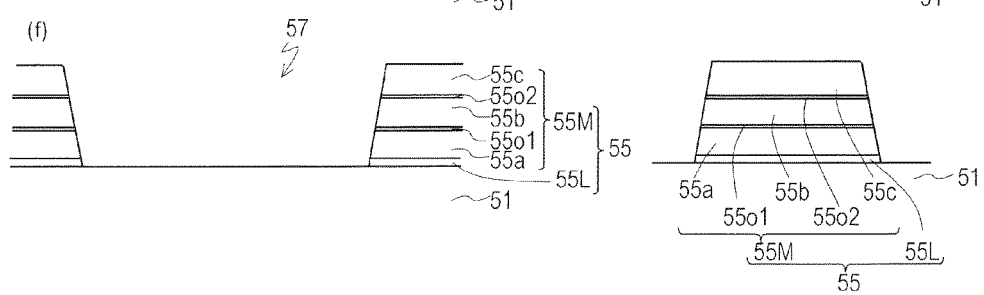
Figure 10:
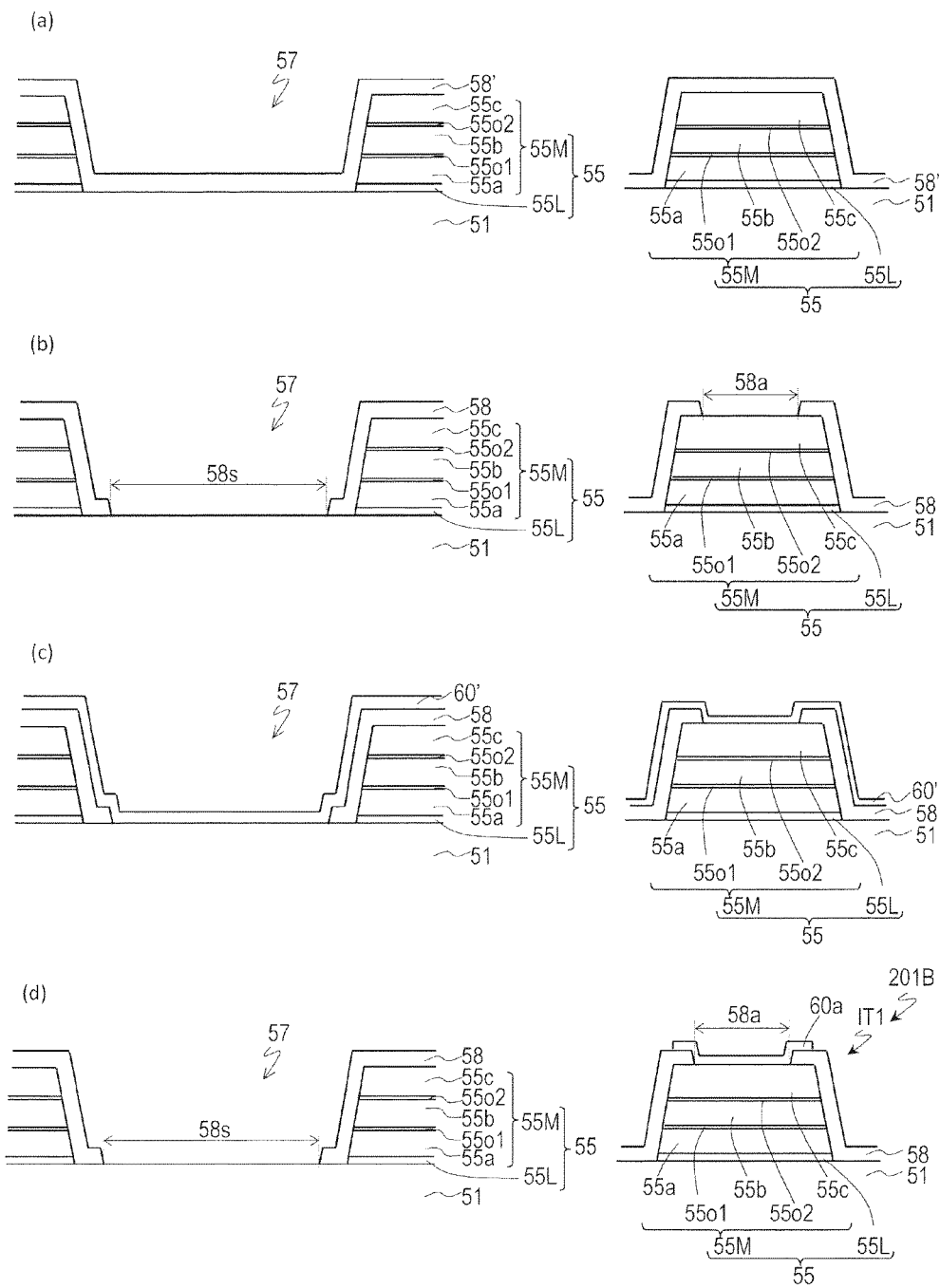
FIGS. 10(a) to 10(d) are schematic cross-sectional views for describing the second manufacturing method of the slot substrate.

A second manufacturing method of a slot substrate and a structure of a slot substrate 201B manufactured by the second manufacturing method will be described with reference to FIG. 9 and FIG. 10.

The second manufacturing method of the slot substrate differs from the first manufacturing method in that the step of bringing the conductive film containing copper into contact with the atmosphere is performed a plurality of times.

FIGS. 9(a) to 9(f) and FIGS. 10(a) to 10(d) are schematic cross-sectional views for describing the manufacturing method of the slot substrate 201B. Each of these figures illustrates the antenna unit region U (a cross section along a line I-I' in FIG. 3) and the first terminal section IT1 (a cross section along a line J-J' in FIG. 3) of the slot substrate 201B. Note that the following description mainly describes differences from the first manufacturing method of the slot substrate 201A.

First, as illustrated in FIG. 9(a), a high melting-point metal film 55L' and a low resistance metal film 55a' (also referred to as a "first conductive film 55a'") are deposited on the dielectric substrate 51. Here, the low resistance metal film 55a' is a conductive film 55a' containing copper. Here, as the high melting-point metal film 55L', a Ti film having a thickness of 20 nm, for example, is deposited, and a Cu film having a thickness of 1000 nm, for example, is deposited as the low resistance metal film 55a' on the high melting-point metal film 55L'.

After that, the low resistance metal film 55a' is brought into contact with the atmosphere. By bringing the low resistance metal film 55a' into contact with the atmosphere, a natural oxide film 55o1' is formed on a surface of the low resistance metal film 55a' as illustrated in FIG. 9(b).

Next, as illustrated in FIG. 9(c), a low resistance metal film 55b' (also referred to as a "second conductive film 55b'") is deposited on the low resistance metal film 55a'. Here, the low resistance metal film 55b' is a conductive film 55b' containing copper. The low resistance metal film 55b' is deposited on the natural oxide film 55o1' formed on the surface of the low resistance metal film 55a'. Here, a Cu film having a thickness of 1000 nm, for example, is deposited as the low resistance metal film 55b'.

After that, the low resistance metal film 55b' is brought into contact with the atmosphere. By bringing the low resistance metal film 55b' into contact with the atmosphere, a natural oxide film 55o2' is formed on a surface of the low resistance metal film 55b' as illustrated in FIG. 9(d).

Next, as illustrated in FIG. 9(e), a low resistance metal film 55c' (also referred to as a "third conductive film 55c'") is deposited on the low resistance metal film 55b'. Here, the low resistance metal film 55c' is a conductive film 55c' containing copper. The low resistance metal film 55c' is deposited on the natural oxide film 55o2' formed on the surface of the low resistance metal film 55b'. Here, a Cu film having a thickness of 1000 nm, for example, is deposited as the low resistance metal film 55c'.

Next, the high melting-point metal film 55L', the low resistance metal films 55a', 55b', and 55c', and the natural oxide films 55o1' and 55o2' are patterned to form the slot electrode 55 having a plurality of slots 57, as illustrated in FIG. 9(f). The slot electrode 55 includes, as the main layer 55M, a first conductive layer 55a containing copper, an oxide layer 55o1 formed on the first conductive layer 55a, containing copper oxide, and having a thickness of less than or equal to 5 nm, a second conductive layer 55b formed on the oxide layer 55o1 and containing copper, an oxide layer 55o2 formed on the second conductive layer 55b, containing copper oxide, and having a thickness of less than or equal to 5 nm, and a third conductive layer 55c formed on the oxide layer 55o2 and containing copper. The slot electrode 55 further includes a lower layer 55L disposed below the main layer 55M.

After that, as illustrated in FIG. 10(a), an insulating film 58' is formed on the slot electrode 55 and within the slots 57.

After that, the insulating film 58' is patterned to form an insulating layer 58 with openings 58s and 58a, as illustrated in FIG. 10(b).

Next, as illustrated in FIG. 10(c), a transparent conductive film 60' is formed on the insulating layer 58, within the openings 58s and 58a.

After that, the transparent conductive film 60' is patterned to form the transparent conductive layer 60 having the upper connection section 60a in contact with the slot electrode 55 within the opening 58a, as illustrated in FIG. 10(d).

In this manner, the slot substrate 201B is manufactured.

As illustrated in FIG. 10(d), the slot electrode 55 included in the slot substrate 201B includes, as the main layer 55M, the first conductive layer 55a containing copper, the oxide layer 55o1 formed on the first conductive layer 55a, containing copper oxide, and having the thickness of less than or equal to 5 nm, the second conductive layer 55b formed on the oxide layer 55o1 and containing copper, the oxide layer 55o2 formed on the second conductive layer 55b, containing copper oxide, and having the thickness of less than or equal to 5 nm, and the third conductive layer 55c formed on the oxide layer 55o2 and containing copper. The slot electrode 55 included in the slot substrate 201B further includes a lower layer 55L disposed below the main layer 55M. The lower layer 55L contains titanium, for example.

This manufacturing method also includes, after depositing a conductive film containing copper to form a main layer of a slot electrode, a step of bring the deposited conductive film into contact with the atmosphere to form a natural oxide film on a surface of the conductive film, and then, a step of further depositing a conductive film on the natural oxide film, thereby suppressing the increase in the substrate temperature. According to this manufacturing method, it is possible to suppress warping of the dielectric substrate and improve the mass productivity of the scanning antenna.

Since this manufacturing method includes a plurality of steps of depositing a conductive film containing copper, and then, bringing the deposited conductive film into contact with the atmosphere, the effect of suppressing the increase in the substrate temperature is great compared to the first manufacturing method.

Third Manufacturing Method of Slot Substrate

Figure 11:
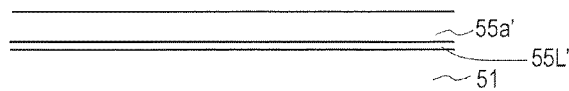
FIGS. 11(a) to 11(f) are schematic cross-sectional views for describing a third manufacturing method of the slot substrate.
Figure 11:
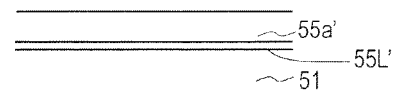
Figure 11:
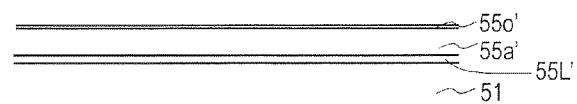
Figure 11:
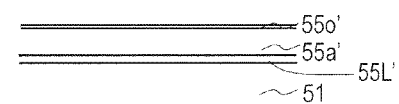
Figure 11:
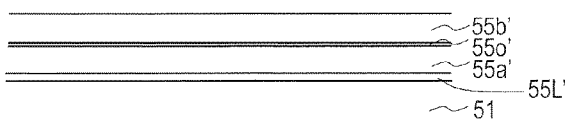
Figure 11:
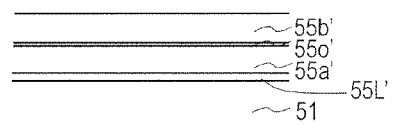
Figure 11:
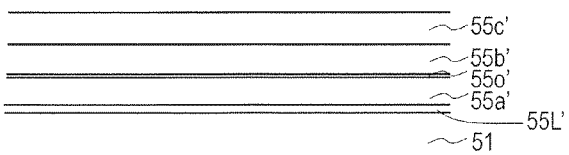
Figure 11:
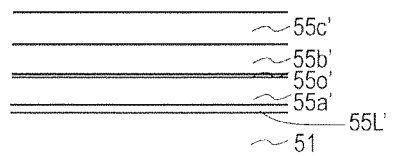
Figure 11:
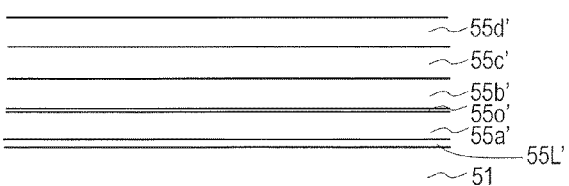
Figure 11:
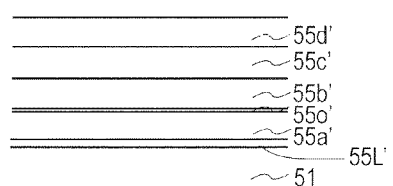
Figure 11:
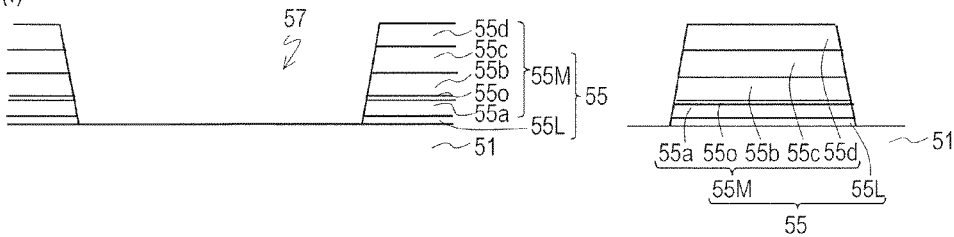
Figure 11:
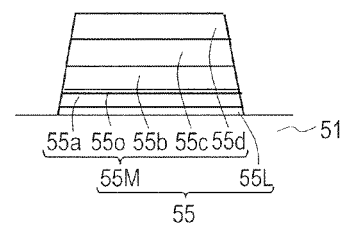
Figure 12:
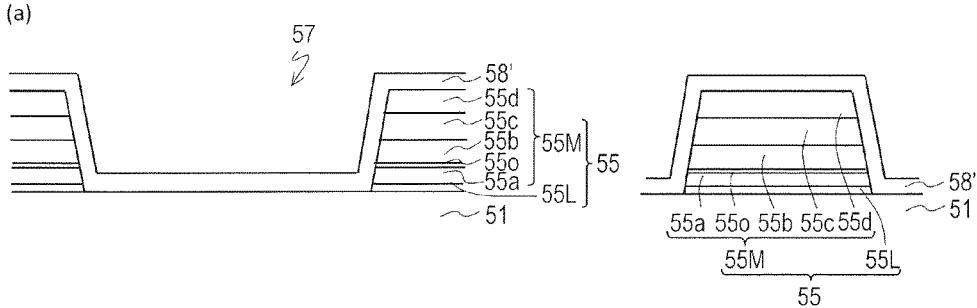
FIGS. 12(a) to 12(d) are schematic cross-sectional views for describing the third manufacturing method of the slot substrate.
Figure 12:
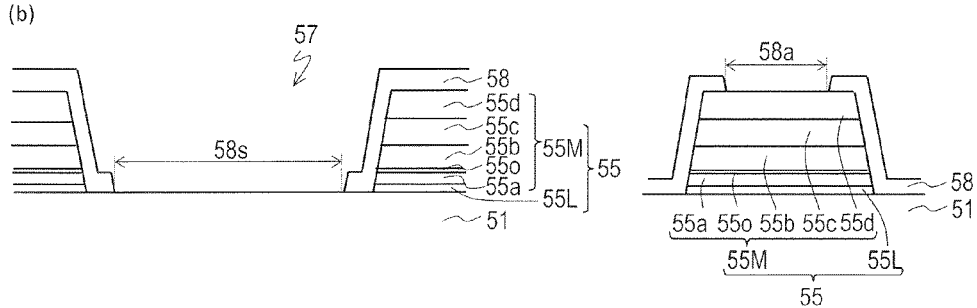
Figure 12:
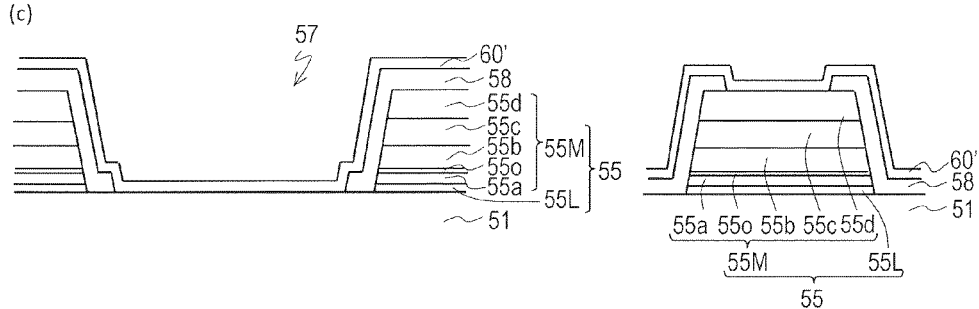
Figure 12:
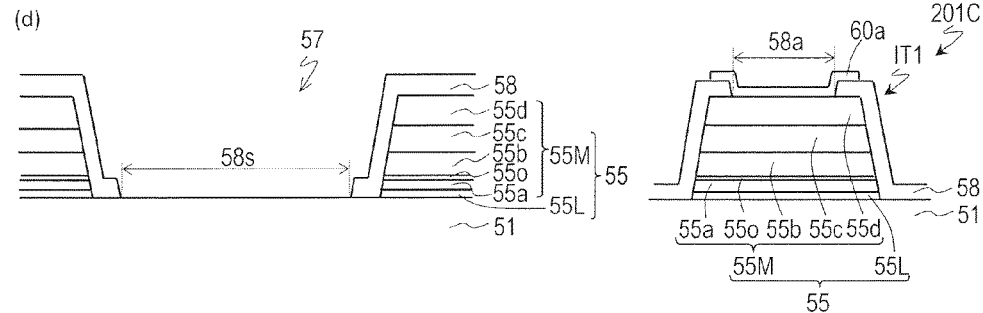

A third manufacturing method of a slot substrate and a structure of a slot substrate 201C manufactured by the third manufacturing method will be described with reference to FIG. 11 and FIG. 12.

FIGS. 11(a) to 11(f) and FIGS. 12(a) to 12(d) are schematic cross-sectional views for describing the manufacturing method of the slot substrate 201C. Each of these figures illustrates the antenna unit region U (a cross section along a line I-I' in FIG. 3) and the first terminal section IT1 (a cross section along a line J-J' in FIG. 3) of the slot substrate 201C. Note that the following description mainly describes differences from the first manufacturing method of the slot substrate 201A.

First, as illustrated in FIG. 11(a), a high melting-point metal film 55L' and a low resistance metal film 55a' (also referred to as a "first conductive film 55a'") are deposited on the dielectric substrate 51. Here, the low resistance metal film 55a' is a conductive film 55a' containing copper. Here, as the high melting-point metal film 55L', a Ti film having a thickness of 20 nm, for example, is deposited, and a Cu film having a thickness of 750 nm, for example, is deposited as the low resistance metal film 55a' on the high melting-point metal film 55L'.

After that, the low resistance metal film 55a' is brought into contact with the atmosphere. By bringing the low resistance metal film 55a' into contact with the atmosphere, a natural oxide film 55o' is formed on a surface of the low resistance metal film 55a' as illustrated in FIG. 11(b).

Next, as illustrated in FIG. 11(c), a low resistance metal film 55b' (also referred to as a "second conductive film 55b'") is deposited on the low resistance metal film 55a'. Here, the low resistance metal film 55b' is a conductive film 55b' containing copper. The low resistance metal film 55b' is deposited on the natural oxide film 55o' formed on the surface of the low resistance metal film 55a'. Here, a Cu film having a thickness of 750 nm, for example, is deposited as the low resistance metal film 55b'.

Next, as illustrated in FIG. 11(d), a low resistance metal film 55c' (also referred to as a "third conductive film 55c'") is deposited on the low resistance metal film 55b'. Here, the low resistance metal film 55c' is a conductive film 55c' containing copper. Here, a Cu film having a thickness of 750 nm is deposited as the low resistance metal film 55c'.

In this manufacturing method, the deposition of the low resistance metal film 55c' is performed in a chamber different from the chamber in which the low resistance metal film 55b' has been deposited. In other words, after the low resistance metal film 55b' is deposited, the low resistance metal film 55b' is moved together with the dielectric substrate 51 to another chamber. Since the movement between the chambers is performed without bringing the low resistance metal film 55b' formed on the dielectric substrate 51 into contact with the atmosphere, the natural oxide film is not formed on the surface of the low resistance metal film 55b'. Here, the low resistance metal film 55b' is not brought into contact with the atmosphere, but the dielectric substrate 51 is moved into a chamber different from the chamber in which the low resistance metal film 55b' is deposited, and therefore, the substrate temperature can be lowered. In a case where the dielectric substrate 51 is moved, an inert gas is preferably introduced into the chamber, for example.

This manufacturing method can be performed using, for example, a multi-chamber apparatus including a transport chamber and a plurality of film formation chambers each connected to the transport chamber. In a case where the multi-chamber apparatus is used, the substrate on which the conductive film is deposited (for example, the glass substrate 51) can move between the film formation chambers via the transport chamber while maintaining a vacuum state. For example, a robot arm is provided in the transport chamber, and the movement of the substrate between the chambers is performed by the robot arm. The multi-chamber apparatus may further include a load lock chamber that changes a pressure between a vacuum state and atmospheric pressure. The load lock chamber is coupled to the transport chamber, for example. In this case, the step of bringing the low resistance metal film 55a' into contact with the atmosphere described above may be performed, for example, by moving the low resistance metal film 55a' into the load lock chamber together with the dielectric substrate 51 and opening the load lock chamber to the atmosphere.

Next, as illustrated in FIG. 11(e), a low resistance metal film 55d' (also referred to as a "fourth conductive film 55d'") is deposited on the low resistance metal film 55c'. Here, the low resistance metal film 55d' is a conductive film 55d' containing copper. Here, a Cu film having a thickness of 750 nm is deposited as the low resistance metal film 55d'.

Next, the high melting-point metal film 55L', the low resistance metal films 55a', 55b', 55c', and 55d', and the natural oxide film 55o' are patterned to form the slot electrode 55 having a plurality of slots 57, as illustrated in FIG. 11(f).

As illustrated in FIG. 11(f), the slot electrode 55 includes, as the main layer 55M, a first conductive layer 55a containing copper, an oxide layer 55o formed on the first conductive layer 55a, containing copper oxide, and having a thickness of less than or equal to 5 nm, a second conductive layer 55b formed on the oxide layer 55o and containing copper, a third conductive layer 55c formed on the second conductive layer 55b and containing copper, and a fourth conductive layer 55d formed on the third conductive layer 55c and containing copper. The slot electrode 55 further includes a lower layer 55L disposed below the main layer 55M.

After that, as illustrated in FIG. 12(a), an insulating film 58' is formed on the slot electrode 55 and within the slots 57.

After that, the insulating film 58' is patterned to form an insulating layer 58 having openings 58s and 58a, as illustrated in FIG. 12(b).

Next, as illustrated in FIG. 12(c), a transparent conductive film 60' is formed on the insulating layer 58, within the openings 58s and 58a.

After that, the transparent conductive film 60' is patterned to form the transparent conductive layer 60 having the upper connection section 60a in contact with the slot electrode 55 within the opening 58a, as illustrated in FIG. 12(d).

In this manner, the slot substrate 201C is manufactured.

As illustrated in FIG. 12(d), the slot electrode 55 included in the slot substrate 201C included in the slot substrate 201C includes, as the main layer 55M, the first conductive layer 55a containing copper, the oxide layer 55o formed on the first conductive layer 55a, containing copper oxide, and having the thickness of less than or equal to 5 nm, the second conductive layer 55b formed on the oxide layer 55o and containing copper, the third conductive layer 55c formed on the second conductive layer 55b and containing copper, and the fourth conductive layer 55d formed on the third conductive layer 55c and containing copper. The slot electrode 55 included in the slot substrate 201C further includes a lower layer 55L disposed below the main layer 55M. The lower layer 55L contains titanium, for example.

Note that in the drawings, the second conductive layer 55b, the third conductive layer 55c, and the fourth conductive layer 55d are illustrated separately. However, in the slot substrate manufactured by the method described above, these layers may be integrally formed (that is, as a single layer).

This manufacturing method also includes, after depositing a conductive film containing copper to form a main layer of a slot electrode, a step of bring the deposited conductive film into contact with the atmosphere to form a natural oxide film on a surface of the conductive film, and then, a step of further depositing a conductive film on the natural oxide film, thereby suppressing the increase in the substrate temperature. According to this manufacturing method, it is possible to suppress warping of the dielectric substrate and improve the mass productivity of the scanning antenna.

Structure of TFT Substrate

A structure of the TFT substrate 101 will be described in detail with reference to FIG. 13 to FIG. 16.

Note that the structure of the TFT substrate included in the scanning antenna according to the embodiments of the disclosure is not limited to the illustrated example.

FIGS. 13(a) to 13(c) are schematic plan views of the TFT substrate 101. FIG. 13(a) illustrates the antenna unit region U in the transmission and/or reception region R1, FIG. 13(b) illustrates the transfer terminal section PT, the gate terminal section GT, and a CS terminal section CT provided in the non-transmission and/or reception region R2, and FIG. 13(c) illustrates a source-gate connection section SG and the source terminal section ST provided in the non-transmission and/or reception region R2.

Figure 16:
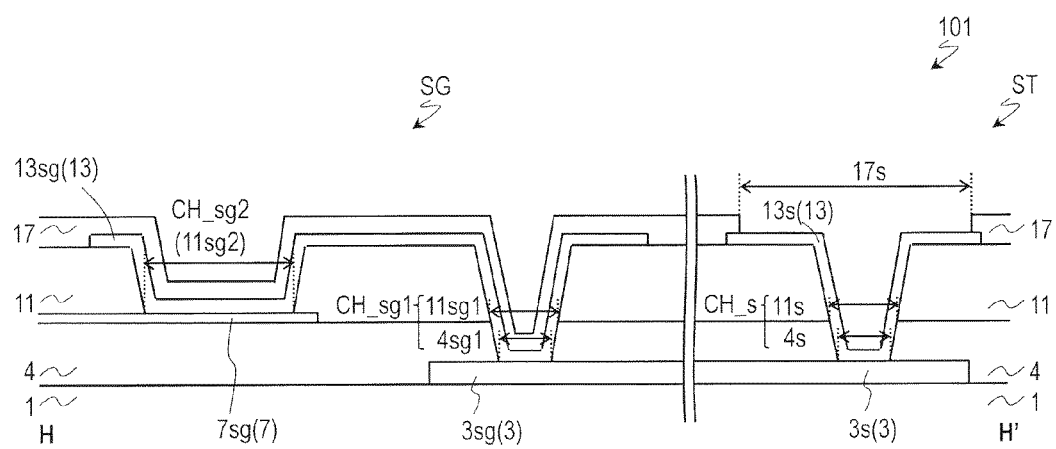
FIG. 16 is a schematic cross-sectional view of the TFT substrate 101.

FIG. 14(a) illustrates a cross-section of the antenna unit region U along a line A-A' in FIG. 13(a), FIG. 14(b) illustrates a cross-section of the first transfer terminal section PT1 along a line B-B' in FIG. 13(b), FIG. 14(c) illustrates a cross-section of the source-gate connection section SG along a line C-C' in FIG. 13(c), FIG. 15(a) illustrates a cross-section of the source terminal section ST along a line D-D' in FIG. 13(c), FIG. 15(b) illustrates a cross-section of the second transfer terminal section PT2 along a line E-E' in FIG. 13(b), FIG. 15(c) illustrates a cross-section of the first transfer terminal section PT1 along a line F-F' in FIG. 13(b), FIG. 15(d) illustrates a cross-section of the source-gate connection section SG along a line G-G' in FIG. 13(c), and FIG. 16 illustrates cross-sections of the source-gate connection section SG and the source terminal section ST along a line H-H' in FIG. 13(c).

In general, the gate terminal section GT and the source terminal section ST are provided for each gate bus line and for each source bus line, respectively. The source-gate connection section SG is provided corresponding to each source bus line, in general. FIG. 13(b) illustrates the CS terminal section CT and the second transfer terminal section PT2 aligned with the gate terminal section GT, but the numbers and arrangements of CS terminal sections CT and second transfer terminal sections PT2 are configured independently from the gate terminal section GT. Typically, the numbers of CS terminal sections CT and second transfer terminal sections PT2 are less than the number of gate terminal sections GT and are adequately configured in consideration of uniformity of voltages of the CS electrode and the slot electrode. The second transfer terminal section PT2 can be omitted in a case where the first transfer terminal section PT1 is formed.

Each CS terminal section CT is provided corresponding to each CS bus line, for example. Each CS terminal section CT may be provided corresponding to a plurality of CS bus lines. For example, in a case where each CS bus line is supplied with the same voltage as the slot voltage, the TFT substrate 101 may include at least one CS terminal section CT. However, in order to decrease a wiring line resistance, the TFT substrate 101 preferably includes a plurality of CS terminal sections CT. Note that the slot voltage is a ground potential, for example. In the case that the CS bus line is supplied with the same voltage as the slot voltage, either the CS terminal section CT or the second transfer terminal section PT2 can be omitted.

Antenna Unit Region U

As illustrated in FIG. 13(a) and FIG. 14(a), each antenna unit region U in the TFT substrate 101 includes the TFT 10 and the patch electrode 15 electrically connected to a drain electrode 7D of the TFT 10.

The TFT substrate 101 includes a gate metal layer 3 supported by the dielectric substrate 1, a gate insulating layer 4 formed on the gate metal layer 3, a source metal layer 7 formed on the gate insulating layer 4, a first insulating layer 11 formed on the source metal layer 7, a patch metal layer 15l formed on the first insulating layer 11, and a second insulating layer 17 formed on the patch metal layer 15l, as illustrated in FIG. 13 to FIG. 16. The TFT substrate 101 further includes a lower conductive layer 13 formed between the first insulating layer 11 and the patch metal layer 15l. The TFT substrate 101 further includes an upper conductive layer 19 formed on the second insulating layer 17.

The TFT 10 included in each antenna unit region U includes a gate electrode 3G, an island-shaped semiconductor layer 5, contact layers 6S and 6D, the gate insulating layer 4 disposed between the gate electrode 3G and the semiconductor layer 5, and a source electrode 7S and the drain electrode 7D. In this example, the TFT 10 is a channel etch-type TFT having a bottom gate structure.

The gate electrode 3G is electrically connected to the gate bus line GL, and supplied with a scanning signal voltage via the gate bus line GL. The source electrode 7S is electrically connected to the source bus line SL, and is supplied with a data signal voltage via the source bus line SL. In this example, the gate electrode 3G and the gate bus line GL are formed of the same conductive film (gate conductive film). Here, the source electrode 7S, the drain electrode 7D, and the source bus line SL are formed of the same conductive film (source conductive film). The gate conductive film and the source conductive film are, for example, metal films.

The semiconductor layer 5 is disposed overlapping the gate electrode 3G with the gate insulating layer 4 interposed therebetween. In the illustrated example, a source contact layer 6S and a drain contact layer 6D are formed on the semiconductor layer 5. The source contact layer 6S and the drain contact layer 6D are disposed on both sides of a region where a channel is formed in the semiconductor layer 5 (channel region). The semiconductor layer 5 may be an intrinsic amorphous silicon (i-a-Si) layer, and the source contact layer 6S and the drain contact layer 6D may be $n^+$ type amorphous silicon ($n^+$-a-Si) layers. The semiconductor layer 5 may be an oxide semiconductor layer. In this case, it is not necessary to provide a contact layer between the semiconductor layer 5, and the source electrode and drain electrode.

The source electrode 7S is provided in contact with the source contact layer 6S and is connected to the semiconductor layer 5 with the source contact layer 6S interposed therebetween. The drain electrode 7D is provided in contact with the drain contact layer 6D and is connected to the semiconductor layer 5 with the drain contact layer 6D interposed therebetween.

Here, each antenna unit region U includes an auxiliary capacitance electrically connected in parallel with the liquid crystal capacitance. In this example, the auxiliary capacitance is constituted by an upper auxiliary capacitance electrode (also referred to as an "auxiliary capacitance electrode" in some cases) 7C electrically connected to the drain electrode 7D, the gate insulating layer 4, and an lower auxiliary capacitance electrode (also referred to as an "auxiliary capacitance counter electrode" in some cases) 3C opposite to the upper auxiliary capacitance electrode 7C with the gate insulating layer 4 interposed therebetween. The lower auxiliary capacitance electrode 3C is included in the gate metal layer 3 and the upper auxiliary capacitance electrode 7C is included in the source metal layer 7. The gate metal layer 3 further includes a CS bus line (auxiliary capacitance line) CL connected to the lower auxiliary capacitance electrode 3C. The CS bus line CL extends substantially in parallel with the gate bus line GL, for example. In this example, the lower auxiliary capacitance electrode 3C is formed integrally with the CS bus line CL. A width of the lower auxiliary capacitance electrode 3C may be larger than a width of the CS bus line CL. In this example, the upper auxiliary capacitance electrode 7C extends from the drain electrode 7D. A width of the upper auxiliary capacitance electrode 7C may be larger than a width of a portion extending from the drain electrode 7D except for the upper auxiliary capacitance electrode 7C. Note that an arrangement relationship between the auxiliary capacitance and the patch electrode 15 is not limited to the example illustrated in the drawing.

The gate metal layer 3 includes the gate electrode 3G of the TFT 10, the gate bus line GL, the lower auxiliary capacitance electrode 3C, and the CS bus line CL.

The source metal layer 7 includes the source electrode 7S and drain electrode 7D of the TFT 10, the source bus line SL, and the upper auxiliary capacitance electrode 7C.

The first insulating layer 11 is formed to cover the TFT 10. The first insulating layer 11 includes an opening 11a that at least reaches the drain electrode 7D or a portion extending from the drain electrode 7D. The opening 11a may be referred to as a contact hole CH_a.

The patch metal layer 15 l includes the patch electrode 15 and a connection section 15a. The connection section 15a is formed on the first insulating layer 11 and within the contact hole CH_a, and is connected to the drain electrode 7D or the portion extending from the drain electrode 7D within the contact hole CH_a. For example, the connection section 15a is in contact with the portion extending from the drain electrode 7D within the opening 11a formed in the first insulating layer 11. In this example, the connection section 15a is formed integrally with a wiring line 15w extending from the patch electrode 15. In this example, the drain electrode 7D is electrically connected to the patch electrode 15 through the connection section 15a and the wiring line 15w.

The patch metal layer 15 l includes a metal layer. The patch metal layer 15 l may be formed only from a metal layer. The patch metal layer 15 l has a layered structure including a low resistance metal layer and a high melting-point metal containing layer under the low resistance metal layer, for example. The patch metal layer 15 l may further include a high melting-point metal containing layer over the low resistance metal layer. The low resistance metal layer of the patch metal layer 15 l may be referred to as a "main layer", and the high melting-point metal containing layers under and over the low resistance metal layer may be referred to as a "lower layer" and an "upper layer", respectively.

The patch metal layer 15 l includes a Cu layer or an Al layer as a main layer, for example. Specifically, the patch electrode 15 includes a Cu layer or an Al layer as a main layer, for example. A performance of the scanning antenna correlates with an electric resistance of the patch electrode 15, and a thickness of the main layer is set so as to obtain a desired resistance. In terms of the electric resistance, there is a possibility that the thickness of the patch electrode 15 can be made thinner in the Cu layer than in the Al layer. A thickness of the metal layer included in the patch metal layer 15 l (that is, a thickness of the metal layer included in the patch electrode 15) is set to be greater than thicknesses of the source electrode 7S and the drain electrode 7D, for example. The thickness of the metal layer in the patch electrode 15 is set to, for example, greater than or equal to 0.3 μm when it is formed of an Al layer.

The second insulating layer 17 is formed to cover the patch electrode 15, the connection section 15a, and the wiring line 15w.

Source-Gate Connection Section SG

The TFT substrate 101 includes the source-gate connection section SG in the non-transmission and/or reception region R2 as illustrated in FIG. 13(c). The source-gate connection section SG is provided for each source bus line SL, in general. The source-gate connection section SG electrically connects each source bus line SL to a connection wiring line (also referred to as a "source lower connection wiring line" in some cases) formed in the gate metal layer 3.

As illustrated in FIG. 13(c), FIG. 14(c), FIG. 15(d), and FIG. 16, the source-gate connection section SG includes a source lower connection wiring line 3sg, an opening 4sg1 formed in the gate insulating layer 4, a source bus line connection section 7sg, an opening 11sg1 and an opening 11sg2 formed in the first insulating layer 11, and a source bus line upper connection section 13sg.

The source lower connection wiring line 3sg is included in the gate metal layer 3. The source lower connection wiring line 3sg is electrically separate from the gate bus line GL.

The opening 4sg1 formed in the gate insulating layer 4 at least reaches the source lower connection wiring line 3sg.

The source bus line connection section 7sg is included in the source metal layer 7 and electrically connected to the source bus line SL. In this example, the source bus line connection section 7sg extends from the source bus line SL and is formed integrally with the source bus line SL. A width of the source bus line connection section 7sg may be larger than a width of the source bus line SL.

The opening 11sg1 formed in the first insulating layer 11 overlaps the opening 4sg1 formed in the gate insulating layer 4 when viewed from the normal direction of the dielectric substrate 1. The opening 4sg1 formed in the gate insulating layer 4 and the opening 11sg1 formed in the first insulating layer 11 constitute a contact hole CH_sg1.

The opening 11sg2 formed in the first insulating layer 11 at least reaches the source bus line connection section 7sg. The opening 11sg2 may be referred to as a contact hole CH_sg2.

The source bus line upper connection section 13sg (also simply referred to as an "upper connection section 13sg") is included in the lower conductive layer 13. The upper connection section 13sg is formed on the first insulating layer 11, within the contact hole CH_sg1, and within the contact hole CH_sg2, is connected to the source lower connection wiring line 3sg within the contact hole CH_sg1, and is connected to the source bus line connection section 7sg within the contact hole CH_sg2. For example, here, the upper connection section 13sg is in contact with the source lower connection wiring line 3sg within the opening 4sg1 formed in the gate insulating layer 4, and in contact with the source bus line connection section 7sg within the opening 11sg2 formed in the first insulating layer 11.

A portion of the source lower connection wiring line 3sg exposed by the opening 4sg1 is preferably covered by the upper connection section 13sg. A portion of the source bus line connection section 7sg exposed by the opening 11sg2 is preferably covered by the upper connection section 13sg.

The lower conductive layer 13 includes, for example, a transparent conductive layer (for example, ITO layer).

In this example, the source-gate connection section SG does not include the conductive portion included in the patch metal layer 15 l and the conductive portion included in the upper conductive layer 19.

The TFT substrate 101 has an excellent actional stability because of including the upper connection section 13sg in the source-gate connection section SG. Because the source-gate connection section SG includes the upper connection section 13sg, damages to the gate metal layer 3 and/or source metal layer 7 in a process of etching a patch conductive film for forming the patch metal layer 15 l are reduced. A description is given of these effects.

As described above, in the TFT substrate 101, the source-gate connection section SG does not include the conductive portion included in the patch metal layer 15l. Specifically, the patch conductive film in a source-gate connection section formation region is removed in a process of patterning the patch conductive film. In a case where the source-gate connection section SG does not include the upper connection section 13sg, the gate metal layer 3 (the source lower connection wiring line 3sg) is exposed within the contact hole CH_sg1, so that the patch conductive film to be removed is deposited within the contact hole CH_sg1 and formed in contact with the source lower connection wiring line 3sg. Similarly, in the case where the source-gate connection section SG does not include the upper connection section 13sg, the source metal layer 7 (the source bus line connection section 7sg) is exposed within the contact hole CH_sg2, so that the patch conductive film to be removed is deposited within the contact hole CH_sg2 and formed in contact with the source bus line connection section 7sg. In such a case, the gate metal layer 3 and/or the source metal layer 7 may suffer an etching damage. In the process of patterning the patch conductive film, for example, an etching solution containing phosphoric acid, nitric acid, and acetic acid is used. If the source lower connection wiring line 3sg and/or the source bus line connection section 7sg suffer the etching damage, a contact failure may occur in the source-gate connection section SG.

The source-gate connection section SG of the TFT substrate 101 includes the upper connection section 13sg formed within the contact hole CH_sg1 and the contact hole CH_sg2. Therefore, the damage to the source lower connection wiring line 3sg and/or the source bus line connection section 7sg caused by the etching in the process of patterning the patch conductive film is reduced. Accordingly, the TFT substrate 101 is excellent in the actional stability.

From the viewpoint of effectively reducing the etching damage to the gate metal layer 3 and/or the source metal layer 7, it is preferable that a portion of the source lower connection wiring line 3sg exposed by the contact hole CH_sg1 is covered by the upper connection section 13sg, and a portion of the source bus line connection section 7sg exposed by the opening 11sg2 is covered by the upper connection section 13sg.

In the TFT substrate used for the scanning antenna, a relatively thick conductive film (the patch conductive film) may be used to form the patch electrode. In this case, the etching time and the overetching time of the patch conductive film can be longer than the etching process of the other layers. At this time, when the gate metal layer 3 (the source lower connection wiring line 3sg) and the source metal layer 7 (the source bus line connection section 7sg) are exposed within the contact hole CH_sg1 and the contact hole CH_sg2, the etching damage to which these metal layers are subjected increases. In this manner, in the TFT substrate having a relatively thick patch metal layer, the effect of reducing the etching damage to the gate metal layer 3 and/or the source metal layer 7 is particularly great due to the source-gate connection section SG having the upper connection section 13sg.

In the illustrated example, the contact hole CH_sg2 is formed at a position away from the contact hole CH_sg1. The present embodiment is not limited to the illustrated example, and the contact hole CH_sg1 and the contact hole CH_sg2 may be contiguous to each other (that is, may be formed as a single contact hole). The contact hole CH_sg1 and the contact hole CH_sg2 may be formed as a single contact hole in the same process. Specifically, a single contact hole that at least reaches the source lower connection wiring line 3sg and source bus line connection section 7sg may be formed in the gate insulating layer 4 and first insulating layer 11 to form the upper connection section 13sg within this contact hole and on the first insulating layer 11. At this time, the upper connection section 13sg is preferably formed to cover a portion of the source lower connection wiring line 3sg and source bus line connection section 7sg exposed by the contact hole.

The lower connection section of the source terminal section ST can be formed of the gate metal layer 3 by providing the source-gate connection section SG as described later. The source terminal section ST including the lower connection section formed of the gate metal layer 3 is excellent in reliability.

Source Terminal Section ST

The TFT substrate 101 includes the source terminal section ST in the non-transmission and/or reception region R2 as illustrated in FIG. 13(c). The source terminal section ST is provided corresponding to each source bus line SL, in general. Here, the source terminal section ST and the source-gate connection section SG are provided corresponding to each source bus line SL.

The source terminal section ST includes a source terminal lower connection section 3s (also simply referred to as a "lower connection section 3s") connected to the source lower connection wiring line 3sg formed in the source-gate connection section SG, an opening 4s formed in the gate insulating layer 4, an opening 11s formed in the first insulating layer 11, a source terminal upper connection section 13s (also simply referred to as an "upper connection section 13s"), and an opening 17s formed in the second insulating layer 17 as illustrated in FIG. 13(c), FIG. 15(a), and FIG. 16.

The lower connection section 3s is included in the gate metal layer 3. The lower connection section 3s is electrically connected to the source lower connection wiring line 3sg formed in the source-gate connection section SG. In this example, the lower connection section 3s extends from the source lower connection wiring line 3sg and is formed integrally with the source lower connection wiring line 3sg.

The opening 4s formed in the gate insulating layer 4 at least reaches the lower connection section 3s.

The opening 11s formed in the first insulating layer 11 overlaps the opening 4s formed in the gate insulating layer 4 when viewed from the normal direction of the dielectric substrate 1. The opening 4s formed in the gate insulating layer 4 and the opening 11s formed in the first insulating layer 11 constitute a contact hole CH_s.

The upper connection section 13s is included in the lower conductive layer 13. The upper connection section 13s is formed on the first insulating layer 11 and within the contact hole CH_s, and is connected to the lower connection section 3s within the contact hole CH_s. Here, the upper connection section 13s is in contact with the lower connection section 3s within the opening 4s formed in the gate insulating layer 4.

The opening 17s formed in the second insulating layer 17 at least reaches the upper connection section 13s.

An entire of the upper connection section 13s may overlap the lower connection section 3s when viewed from the normal direction of the dielectric substrate 1.

In this example, the source terminal section ST does not include the conductive portion included in the source metal layer 7, the conductive portion included in the patch metal layer 15l, and the conductive portion included in the upper conductive layer 19.

The source terminal section ST, which includes the lower connection section 3s included in the gate metal layer 3, has excellent reliability.

In the terminal section, particularly, the terminal section provided outside the seal region Rs (opposite to the liquid crystal layer), corrosion may occur due to atmospheric moisture (which may contain impurities). The atmospheric moisture intrudes from the contact hole at least reaching the lower connection section and at least reaches the lower connection section so that corrosion may occur in the lower connection section. From the viewpoint of suppressing the corrosion occurring, the contact hole that at least reaches the lower connection section is preferably deep. In other words, the thickness of the insulating layer where the opening constituting the contact hole is formed is preferably large.

In a process of fabricating a TFT substrate including a glass substrate as a dielectric substrate, broken pieces or chips (cullets) of the glass substrate may cause scratches or disconnection in the lower connection section of the terminal section. For example, a plurality of TFT substrates are fabricated from one mother substrate. The cullet is generated in cutting the mother substrate or in forming scribe lines in the mother substrate, for example. From the viewpoint of preventing the scratches and disconnection in the lower connection section of the terminal section, the contact hole that at least reaches the lower connection section is preferably deep. In other words, the thickness of the insulating layer where the opening constituting the contact hole is formed is preferably large.

In the source terminal section ST of the TFT substrate 101, since the lower connection section 3s is included in the gate metal layer 3, the contact hole CH_s that at least reaches the lower connection section 3s includes the opening 4s formed in the gate insulating layer 4 and the opening 11s formed in the first insulating layer 11. A depth of the contact hole CH_s is a sum of a thickness of the gate insulating layer 4 and a thickness of the first insulating layer 11. In contrast, in a case where the lower connection section is included in the source metal layer 7, for example, the contact hole that at least reaches the lower connection section includes only an opening formed in the first insulating layer 11, and a depth of the opening is the thickness of the first insulating layer 11 and is smaller than the depth of the contact hole CH_s. Here, the depth of the contact hole and the thickness of the insulating layer are respectively a depth and a thickness in the normal direction of the dielectric substrate 1. The same holds for other contact holes and insulating layers unless otherwise specifically described. In this way, the source terminal section ST of the TFT substrate 101 includes the lower connection section 3s included in the gate metal layer 3, and therefore, has excellent reliability as compared with the case that the lower connection section is included in the source metal layer 7, for example.

The opening 4s formed in the gate insulating layer 4 is formed to expose only a portion of the lower connection section 3s. The opening 4s formed in the gate insulating layer 4 is inside the lower connection section 3s when viewed from the normal direction of the dielectric substrate 1. Therefore, the entire region within the opening 4s has a layered structure including the lower connection section 3s and the upper connection section 13s on the dielectric substrate 1. In the source terminal section ST, a portion outside the lower connection section 3s has a layered structure including the gate insulating layer 4 and the first insulating layer 11. With this configuration, the source terminal section ST of the TFT substrate 101 has excellent reliability. From the viewpoint of obtaining the excellent reliability, the sum of the thicknesses of the gate insulating layer 4 and the thickness of the first insulating layer 11 is preferably large.

A portion of the lower connection section 3s exposed by the opening 4s is covered by the upper connection section 13s.

Gate Terminal Section GT

The TFT substrate 101 includes the gate terminal section GT in the non-transmission and/or reception region R2 as illustrated in FIG. 13(b). The gate terminal section GT may have the same configuration as the source terminal section ST as illustrated in FIG. 13(b), for example. The gate terminal section GT is provided for each gate bus line GL, in general.

As illustrated in FIG. 13(b), in this example, the gate terminal section GT includes a gate terminal lower connection section 3 g (also simply referred to as a "lower connection section 3g"), an opening 4 g formed in the gate insulating layer 4, an opening 11 g formed in the first insulating layer 11, a gate terminal upper connection section 13 g (also simply referred to as an "upper connection section 13g"), and an opening 17 g formed in the second insulating layer 17.

The lower connection section 3 g is included in the gate metal layer 3 and electrically connected to the gate bus line GL. In this example, the lower connection section 3 g extends from the gate bus line GL and is formed integrally with the gate bus line GL.

The opening 4 g formed in the gate insulating layer 4 at least reaches the lower connection section 3g.

The opening 11 g formed in the first insulating layer 11 overlaps the opening 4 g formed in the gate insulating layer 4 when viewed from the normal direction of the dielectric substrate 1. The opening 4 g formed in the gate insulating layer 4 and the opening 11 g formed in the first insulating layer 11 constitute a contact hole CH_g.

The upper connection section 13 g is included in the lower conductive layer 13. The upper connection section 13 g is formed on the first insulating layer 11 and within the contact hole CH_g, and is connected to the lower connection section 3 g within the contact hole CH_g. Here, the upper connection section 13 g is in contact with the lower connection section 3 g within the opening 4 g formed in the gate insulating layer 4.

The opening 17 g formed in the second insulating layer 17 at least reaches the upper connection section 13g.

An entire of the upper connection section 13 g may overlap the lower connection section 3 g when viewed from the normal direction of the dielectric substrate 1.

In this example, the gate terminal section GT does not include the conductive portion included in the source metal layer 7, the conductive portion included in the patch metal layer 15l, and the conductive portion included in the upper conductive layer 19.

The gate terminal section GT, which includes the lower connection section 3 g included in the gate metal layer 3, has excellent reliability similar to the source terminal section ST.

CS Terminal Section CT

The TFT substrate 101 includes the CS terminal section CT in the non-transmission and/or reception region R2 as illustrated in FIG. 13(b). The CS terminal section CT here has the same configuration as the source terminal section ST and gate terminal section GT as illustrated in FIG. 13(b). The CS terminal section CT may be provided corresponding to each CS bus line CL, for example.

As illustrated in FIG. 13(b), the CS terminal section CT includes a CS terminal lower connection section 3c (also simply referred to as a "lower connection section 3c"), an opening 4c formed in the gate insulating layer 4, an opening 11c formed in the first insulating layer 11, a CS terminal upper connection section 13c (also simply referred to as an "upper connection section 13c"), and an opening 17c formed in the second insulating layer 17.

The lower connection section 3c is included in the gate metal layer 3. The lower connection section 3c is electrically connected to the CS bus line CL. In this example, the lower connection section 3c extends from the CS bus line CL and is formed integrally with the CS bus line CL.

The opening 4c formed in the gate insulating layer 4 at least reaches the lower connection section 3c.

The opening 11c formed in the first insulating layer 11 overlaps the opening 4c formed in the gate insulating layer 4 when viewed from the normal direction of the dielectric substrate 1. The opening 4c formed in the gate insulating layer 4 and the opening 11c formed in the first insulating layer 11 constitute a contact hole CH_c.

The upper connection section 13c is included in the lower conductive layer 13. The upper connection section 13c is formed on the first insulating layer 11 and within the contact hole CH_c, and is connected to the lower connection section 3c within the contact hole CH_c. Here, the upper connection section 13c is in contact with the lower connection section 3c within the opening 4c formed in the gate insulating layer 4.

The opening 17c formed in the second insulating layer 17 at least reaches the upper connection section 13c.

An entire of the upper connection section 13c may overlap the lower connection section 3c when viewed from the normal direction of the dielectric substrate 1.

In this example, the CS terminal section CT does not include the conductive portion included in the source metal layer 7, the conductive portion included in the patch metal layer 15 l and the conductive portion included in the upper conductive layer 19.

The CS terminal section CT, which includes the lower connection section 3c included in the gate metal layer 3, has excellent reliability similar to the source terminal section ST.

Transfer Terminal Section PT

The TFT substrate 101 includes the first transfer terminal section PT1 in the non-transmission and/or reception region R2 as illustrated in FIG. 13(b). The first transfer terminal section PT1 is provided in the seal region Rs, here (that is, the first transfer terminal section PT1 is provided in the sealing portion surrounding the liquid crystal layer).

The first transfer terminal section PT1 includes a first transfer terminal lower connection section 3p1 (also simply referred to as a "lower connection section 3p1"), an opening 4p1 formed in the gate insulating layer 4, an opening 11p1 formed in the first insulating layer 11, a first conductive portion for first transfer terminal 13p1 (also simply referred to as a "first conductive portion 13p1"), a second conductive portion for first transfer terminal 15p1 (also simply referred to as a "second conductive portion 15p1"), an opening 17p1 formed in the second insulating layer 17, and a first transfer terminal upper connection section 19p1 (also simply referred to as an "upper connection section 19p1") as illustrated in FIG. 13(b) and FIG. 14(b).

The lower connection section 3p1 is included in the gate metal layer 3. That is, the lower connection section 3p1 is formed of the same conductive film as that of the gate bus line GL. The lower connection section 3p1 is electrically separate from the gate bus line GL. For example, in a case where the CS bus line CL is supplied with the same voltage as the slot voltage, the lower connection section 3p1 is electrically connected to, for example, the CS bus line CL. As is illustrated, the lower connection section 3p1 may extend from the CS bus line. However, the lower connection section 3p1 is not limited to the illustrated example and may be electrically separate from the CS bus line.

The opening 4p1 formed in the gate insulating layer 4 at least reaches the lower connection section 3p1.

The opening 11p1 formed in the first insulating layer 11 overlaps the opening 4p1 formed in the gate insulating layer 4 when viewed from the normal direction of the dielectric substrate 1. The opening 4p1 formed in the gate insulating layer 4 and the opening 11p1 formed in the first insulating layer 11 constitute a contact hole CH_p1.

The first conductive portion 13p1 is included in the lower conductive layer 13. The first conductive portion 13p1 is formed on the first insulating layer 11 and within the contact hole CH_p1, and is connected to the lower connection section 3p1 within the contact hole CH_p1. Here, the first conductive portion 13p1 is in contact with the lower connection section 3p1 within the opening 4p1.

The second conductive portion 15p1 is included in the patch metal layer 15l. The second conductive portion 15p1 is formed on the first insulating layer 11 and on the first conductive portion 13p1 to be in contact with the first conductive portion 13p1. For example, here, the second conductive portion 15p1 is in contact with the first conductive portion 13p1.

The opening (contact hole) 17p1 formed in the second insulating layer 17 at least reaches the second conductive portion 15p1.

The upper connection section 19p1 is included in the upper conductive layer 19. The upper connection section 19p1 is formed on the second insulating layer 17 and within the opening 17p1, and is connected to the second conductive portion 15p1 within the opening 17p1. Here, the upper connection section 19p1 is in contact with the second conductive portion 15p1 within the opening 17p1.

In this example, the first transfer terminal section PT1 does not include the conductive portion included in the source metal layer 7.

The upper conductive layer 19 includes, for example, a transparent conductive layer (for example, ITO layer). The upper conductive layer 19 may be formed of only a transparent conductive layer, for example. Alternatively, the upper conductive layer 19 may include a first upper conductive layer including a transparent conductive layer and a second upper conductive layer formed under the first upper conductive layer. The second upper conductive layer is formed of one layer or two or more layers selected from the group consisting of a Ti layer, a MoNbNi layer, a MoNb layer, a MoW layer, a W layer and a Ta layer, for example.

The first transfer terminal section PT1 includes the first conductive portion 13p1 and second conductive portion 15p1 between the lower connection section 3p1 and the upper connection section 19p1. This allows the first transfer terminal section PT1 to have an advantage that an electric resistance between the lower connection section 3p1 and the upper connection section 19p1 is low.

An entire of the upper connection section 19p1 may overlap the second conductive portion 15p1 when viewed from the normal direction of the dielectric substrate 1.

In this example, the lower connection section 3p1 is disposed between two gate bus lines GL adjacent to each other. Two lower connection sections 3p1 disposed with the gate bus line GL being interposed therebetween may be electrically connected to each other via a conductive connection section (not illustrated). The conductive connection section electrically connecting two lower connection sections 3p1 may be included, for example, in the source metal layer 7.

Here, a plurality of contact holes CH_p1 are provided so that the lower connection section 3p1 is connected to the upper connection section 19p1 with the second conductive portion 15p1 interposed therebetween, but one or more contact holes CH_p1 may be provided to one lower connection section 3p1. One contact hole may be provided to one lower connection section 3p1. The number of contact holes or the shapes thereof are not limited to the illustrated example.

The second transfer terminal section PT2 is provided outside the seal region Rs (opposite to the transmission and/or reception region R1). The second transfer terminal section PT2 includes a second transfer terminal lower connection section 15p2 (also simply referred to as a "lower connection section 15p2"), an opening 17p2 formed in the second insulating layer 17, and a second transfer terminal upper connection section 19p2 (also simply referred to as an "upper connection section 19p2") as illustrated in FIG. 13(b) and FIG. 15(b).

The second transfer terminal section PT2 has a cross-sectional structure the same as a portion of the first transfer terminal section PT1 not including the lower connection section 3p1, the first conductive portion 13p1, and the contact hole CH_p1 (see FIG. 15(c)).

The lower connection section 15p2 is included in the patch metal layer 15l. Here, the lower connection section 15p2 extends from the second conductive portion for first transfer terminal 15p1 and is formed integrally with the second conductive portion for first transfer terminal 15p1.

The opening (contact hole) 17p2 formed in the second insulating layer 17 at least reaches the lower connection section 15p2.

The upper connection section 19p2 is included in the upper conductive layer 19. The upper connection section 19p2 is formed on the second insulating layer 17 and within the opening 17p2, and is connected to the lower connection section 15p2 within the opening 17p2. Here, the upper connection section 19p2 is in contact with the lower connection section 15p2 within the opening 17p2.

In this example, the second transfer terminal section PT2 does not include the conductive portion included in the gate metal layer 3, the conductive portion included in the source metal layer 7, and the conductive portion included in the lower conductive layer 13.

Material and Structure of TFT

In the present embodiment, a TFT including a semiconductor layer 5 as an active layer is used as a switching element disposed in each pixel. The semiconductor layer 5 is not limited to an amorphous silicon layer, and may be a polysilicon layer or an oxide semiconductor layer.

In a case where an oxide semiconductor layer is used, the oxide semiconductor included in the oxide semiconductor layer may be an amorphous oxide semiconductor or a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a dual-layer structure including an upper layer and a lower layer, an energy gap of the oxide semiconductor included in the upper layer is preferably greater than an energy gap of the oxide semiconductor included in the lower layer. However, when a difference in the energy gap between these layers is relatively small, the energy gap of the oxide semiconductor in the lower layer may be greater than the energy gap of the oxide semiconductor in the upper layer.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. Since a TFT including an In—Ga—Zn—O based semiconductor layer has high mobility (more than 20 times in comparison with a-Si TFTs) and low leakage current (less than 1/100th in comparison with a-Si TFTs), such a TFT can suitably be used as a driving TFT (for example, a TFT included in a driving circuit provided in the non-transmission and/or reception region) and a TFT provided in each antenna unit region.

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, a CdO (cadmium oxide), an Mg—Zn—O based semiconductor, an In—Ga—Sn—O based semiconductor, an In—Ga—O based semiconductor, a Zr—In—Zn—O based semiconductor, an Hf—In—Zn—O based semiconductor, an Al—Ga—Zn—O based semiconductor, or a Ga—Zn—O based semiconductor.

In the example illustrated in FIG. 13(a) and FIG. 14(a), the TFT 10 is a channel etch type TFT having a bottom gate structure. The "channel etch type TFT" does not include an etch stop layer formed on the channel region, and a lower face of an end portion of each of the source and drain electrodes, which is closer to the channel, is provided so as to be in contact with an upper face of the semiconductor layer. The channel etch type TFT is formed by, for example, forming a conductive film for a source/drain electrode on a semiconductor layer and performing source/drain separation. In the source/drain separation process, the surface portion of the channel region may be etched.

Note that the TFT 10 may be an etch stop type TFT in which an etch stop layer is formed on the channel region. In the etch stop type TFT, the lower face of an end portion of each of the source and drain electrodes, which is closer to the channel, is located, for example, on the etch stop layer. The etch stop type TFT is formed as follows; after forming an etch stop layer covering the portion that will become the channel region in a semiconductor layer, for example, a conductive film for the source and drain electrodes is formed on the semiconductor layer and the etch stop layer, and source/drain separation is performed.

In addition, although the TFT 10 has a top contact structure in which the source and drain electrodes are in contact with the upper face of the semiconductor layer, the source and drain electrodes may be disposed to be in contact with the lower face of the semiconductor layer (a bottom contact structure). Furthermore, the TFT 10 may have a bottom gate structure having a gate electrode on the dielectric substrate side of the semiconductor layer, or a top gate structure having a gate electrode above the semiconductor layer.

The scanning antenna according to the embodiments of the disclosure is housed in a plastic housing as necessary, for example. It is preferable to use a material having a small dielectric constant $\varepsilon_M$ that does not affect microwave transmission and/or reception in the housing. In addition, the housing may include a through-hole provided in a portion thereof corresponding to the transmission and/or reception region R1. Furthermore, the housing may include a light blocking structure such that the liquid crystal material is not exposed to light. The light blocking structure is, for example, provided so as to block light that propagates through the dielectric substrate 1 and/or 51 from the side surface of the dielectric substrate 1 of the TFT substrate 101 and/or the side surface of the dielectric substrate 51 of the slot substrate 201 and is incident upon the liquid crystal layer. A liquid crystal material having a large dielectric anisotropy $\Delta\varepsilon_M$ may be prone to photodegradation, and as such it is preferable to shield not only ultraviolet rays but also short-wavelength blue light from among visible light. By using a light-blocking tape such as a black adhesive tape, for example, the light blocking structure can be easily formed in necessary locations.

INDUSTRIAL APPLICABILITY

Embodiments according to the disclosure are used in scanning antennas for satellite communication or satellite broadcasting that are mounted on mobile bodies (ships, aircraft, and automobiles, for example) or the manufacture thereof.

REFERENCE SIGNS LIST

1 Dielectric substrate
3 Gate metal layer
3C Auxiliary capacitance counter electrode
3G Gate electrode
3c, 3 g, 3p1, 3s Lower connection section
3sg Source lower connection wiring line
4 Gate insulating layer
4c, 4 g, 4p1, 4s, 4sg1 Opening
5 Semiconductor layer
6D Drain contact layer
6S Source contact layer
7 Source metal layer
7C Auxiliary capacitance electrode
7D Drain electrode
7S Source electrode
7sg Source bus line connection section
11 First insulating layer
11a, 11c, 11 g, 11p1 Opening
11s, 11sg1, 11sg2 Opening
13 Lower conductive layer
13c, 13 g, 13s Upper connection section
13sg Source bus line upper connection section
15 Patch electrode
15a Connection section
15 l Patch metal layer
15p1 Upper connection section
15p2 Connection section
17 Second insulating layer
17c, 17 g, 17p1, 17p2, 17s Opening
51 Dielectric substrate
54 Dielectric layer (air layer)
55 Slot electrode
55L Lower layer
55M Main layer
55a, 55b, 55c, 55d Conductive layer
55o, 55o1, 55o2 Oxide layer
57 Slot
58 Insulating layer
58a, 58b, 58s Opening
60 Transparent conductive layer
60a, 60b Upper connection section
65 Reflective conductive plate
70 Power feed device
71 Conductive beads
72 Power feed pin
73 Sealing portion
101 TFT substrate
201 Slot substrate
301 Waveguide
1000 Scanning antenna
CH_a, CH_c, CH_g Contact hole
CH_p1, CH_s, CH_sg1, CH_sg2 Contact hole
CL CS bus line
CT CS terminal section
GD Gate driver
GL Gate bus line
GT Gate terminal section
IT Terminal section
IT1 First terminal section
IT2 Second terminal section
LC Liquid crystal layer
PT Transfer terminal section
PT1 First transfer terminal section
PT2 Second transfer terminal section
R1 Transmission and/or reception region
R2 Non-transmission and/or reception region
R2a First non-transmission and/or reception region
R2b Second non-transmission and/or reception region
Rs Seal region
SD Source driver
SG Source-gate connection section
SL Source bus line
ST Source terminal section
U Antenna unit, Antenna unit region

The invention claimed is:

1. A method for manufacturing a scanning antenna with a plurality of antenna units arrayed in the scanning antenna, the scanning antenna including
a TFT substrate including
a first dielectric substrate,
a plurality of TFTs supported by the first dielectric substrate,
a plurality of gate bus lines,
a plurality of source bus lines, and
a plurality of patch electrodes, each patch electrode being electrically connected to a drain electrode of a corresponding TFT of the plurality of TFTs,
a slot substrate including
a second dielectric substrate and
a slot electrode being formed on a first main surface of the second dielectric substrate and including a plurality of slots disposed corresponding to the plurality of patch electrodes,
a liquid crystal layer provided between the TFT substrate and the slot substrate, and
a reflective conductive plate disposed to face a second main surface of the second dielectric substrate on a side opposite to the first main surface with a dielectric layer interposed between the reflective conductive plate and the second main surface,
the method comprising:
a step (a) of depositing a first conductive film containing copper on the first main surface of the second dielectric substrate;
a step (b) of, after the step (a), bringing the first conductive film into contact with an atmosphere to form an oxide film on a surface of the first conductive film; and
a step (c) of, after the step (b), depositing a second conductive film containing copper on the oxide film.

2. The method for manufacturing a scanning antenna according to claim 1,
wherein the step (b) is performed such that a temperature of the second dielectric substrate is less than or equal to 60° C.

3. The method for manufacturing a scanning antenna according to claim 1,
wherein the step (b) includes a step of taking out the second dielectric substrate and the first conductive film from a chamber in which the first conductive film has been deposited in the step (a).

4. The method for manufacturing a scanning antenna according to claim 1,
wherein the step (a) is performed such that the temperature of the second dielectric substrate does not exceed 130° C.

5. The method for manufacturing a scanning antenna according to claim 1,
wherein a thickness of the first conductive film deposited in the step (a) is less than or equal to 2 μm.

6. The method for manufacturing a scanning antenna according to claim 1,
wherein the step (b) includes a step of leaving the second dielectric substrate and the first conductive film for one minute or longer outside the chamber in which the first conductive film has been deposited in the step (a).

7. The method for manufacturing a scanning antenna according to claim 1,
wherein a copper content rate in the first conductive film deposited in the step (a) is greater than or equal to 95 mass %.

8. The method for manufacturing a scanning antenna according to claim 1, further comprising:
a step of, prior to the step (a), depositing a lower conductive film containing titanium on the first main surface of the second dielectric substrate.

9. The method for manufacturing a scanning antenna according to claim 1, further comprising:
a step (d) of, after the step (c), bringing the second conductive film into contact with the atmosphere to form a further oxide film on a surface of the second conductive film; and
a step (e) of, after the step (d), depositing a third conductive film containing copper on the further oxide film.

10. A scanning antenna with a plurality of antenna units arrayed in the scanning antenna, the scanning antenna comprising:
a TFT substrate including
a first dielectric substrate,
a plurality of TFTs supported by the first dielectric substrate,
a plurality of gate bus lines,
a plurality of source bus lines, and
a plurality of patch electrodes, each patch electrode being electrically connected to a drain electrode of a corresponding TFT of the plurality of TFTs;
a slot substrate including
a second dielectric substrate and
a slot electrode being formed on a first main surface of the second dielectric substrate and including a plurality of slots disposed corresponding to the plurality of patch electrodes;
a liquid crystal layer provided between the TFT substrate and the slot substrate; and
a reflective conductive plate disposed to face a second main surface of the second dielectric substrate on a side opposite to the first main surface with a dielectric layer interposed between the reflective conductive plate and the second main surface,
wherein the slot electrode includes
a first conductive layer containing copper,
an oxide layer formed on the first conductive layer, containing copper oxide, and having a thickness of less than or equal to 5 nm, and
a second conductive layer formed on the oxide layer and containing copper.

11. The scanning antenna according to claim 10,
wherein the slot electrode further includes a lower conductive layer containing titanium under the first conductive layer.

12. The scanning antenna according to claim 10,
wherein a thickness of the first conductive layer is less than or equal to 2 μm.

13. The scanning antenna according to claim 10,
wherein a copper content rate of the first conductive layer is greater than or equal to 95 mass %.

14. The scanning antenna according to claim 10,
wherein the slot electrode further includes
a further oxide layer formed on the second conductive layer, containing copper oxide, and having a thickness of less than or equal to 5 nm, and
a third conductive layer formed on the further oxide layer and containing copper.

* * * * *